US011430793B2

(12) United States Patent
Pandey et al.

(10) Patent No.: US 11,430,793 B2
(45) Date of Patent: Aug. 30, 2022

(54) MICROELECTRONIC DEVICES INCLUDING PASSING WORD LINE STRUCTURES, AND RELATED ELECTRONIC SYSTEMS AND METHODS

(71) Applicant: Micron Technology, Inc., Boise, ID (US)

(72) Inventors: Deepak Chandra Pandey, Almora (IN); Venkata Naveen Kumar Neelapala, Hyderabad (IN); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 11 days.

(21) Appl. No.: 16/899,339

(22) Filed: Jun. 11, 2020

(65) Prior Publication Data
US 2021/0391337 A1 Dec. 16, 2021

(51) Int. Cl.
*H01L 27/108* (2006.01)
(52) U.S. Cl.
CPC .. *H01L 27/10891* (2013.01); *H01L 27/10876* (2013.01)
(58) Field of Classification Search
CPC ............... H01L 27/10876; H01L 27/10891
USPC ....................................................... 257/330
See application file for complete search history.

(56) References Cited

U.S. PATENT DOCUMENTS

| 5,892,707 | A | 4/1999 | Noble |
| 9,385,132 | B2 | 7/2016 | Heineck et al. |
| 9,449,978 | B2 | 9/2016 | Karda et al. |
| 9,543,433 | B2 | 1/2017 | Anathan et al. |
| 2011/0260242 | A1* | 10/2011 | Jang ............... H01L 29/4966 257/331 |
| 2015/0311297 | A1* | 10/2015 | Im ................. H01L 27/10876 257/331 |
| 2015/0333059 | A1* | 11/2015 | Lee ............... H01L 27/10876 257/334 |
| 2016/0172363 | A1 | 6/2016 | Doebler |

FOREIGN PATENT DOCUMENTS

WO 2017/052621 A1 3/2017

OTHER PUBLICATIONS

Lin, Sheng, Analysis and Design of Robust Storage Elements in Nanometric Circuits, The Department of Electrical and Computer Engineering, Northeastern University, (May 2011), 166 pages.

* cited by examiner

*Primary Examiner* — Hoai V Pham
(74) *Attorney, Agent, or Firm* — TraskBritt

(57) ABSTRACT

A microelectronic device comprises a first pillar of a semiconductive material, a second pillar of the semiconductive material adjacent to the first pillar of the semiconductive material, an active word line extending between the first pillar and the second pillar, and a passing word line extending on a side of the second pillar opposite the active word line, the passing word line extending into an isolation region within the semiconductive material, the isolation region comprising a lower portion and an upper portion having a substantially circular cross-sectional shape and a larger lateral dimension than the lower portion. Related microelectronic devices, electronic systems, and methods are also described.

23 Claims, 17 Drawing Sheets

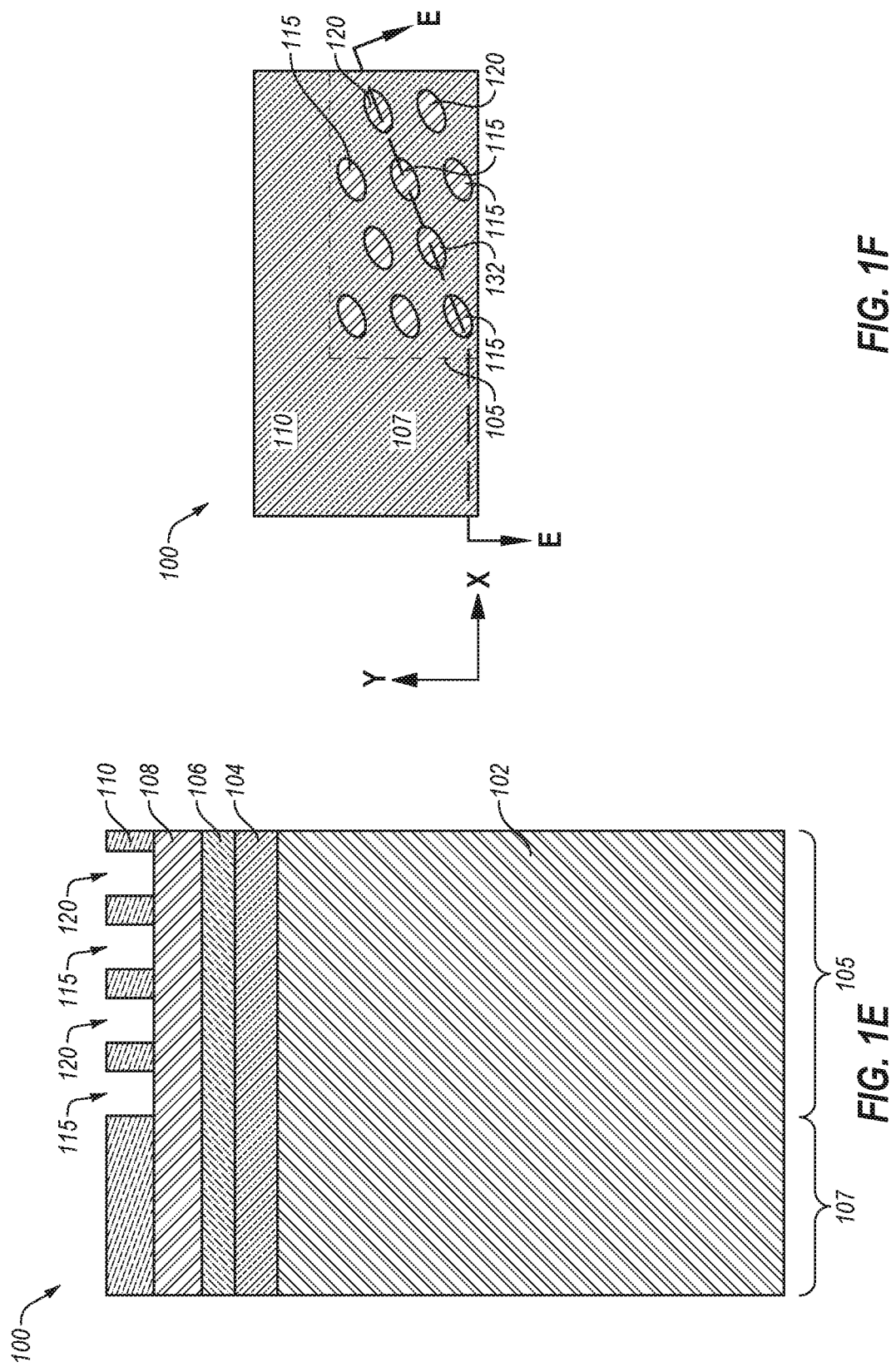

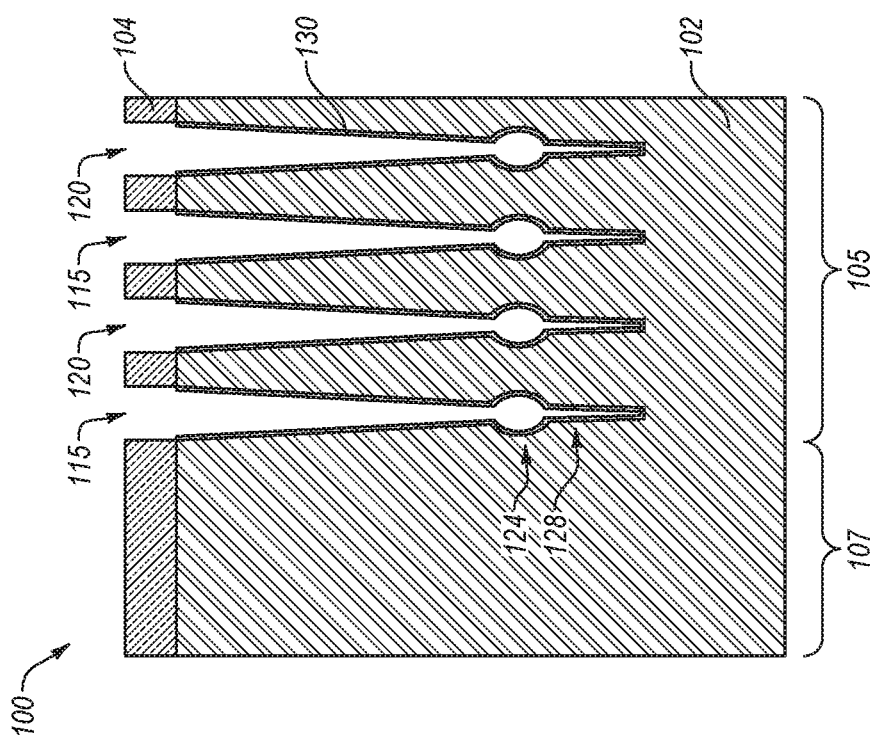

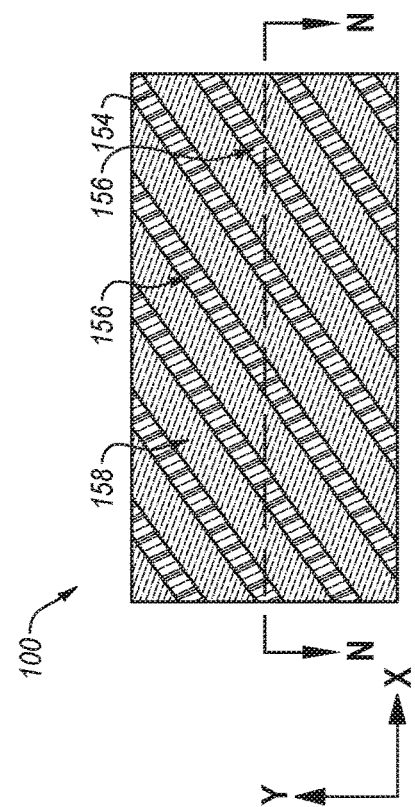
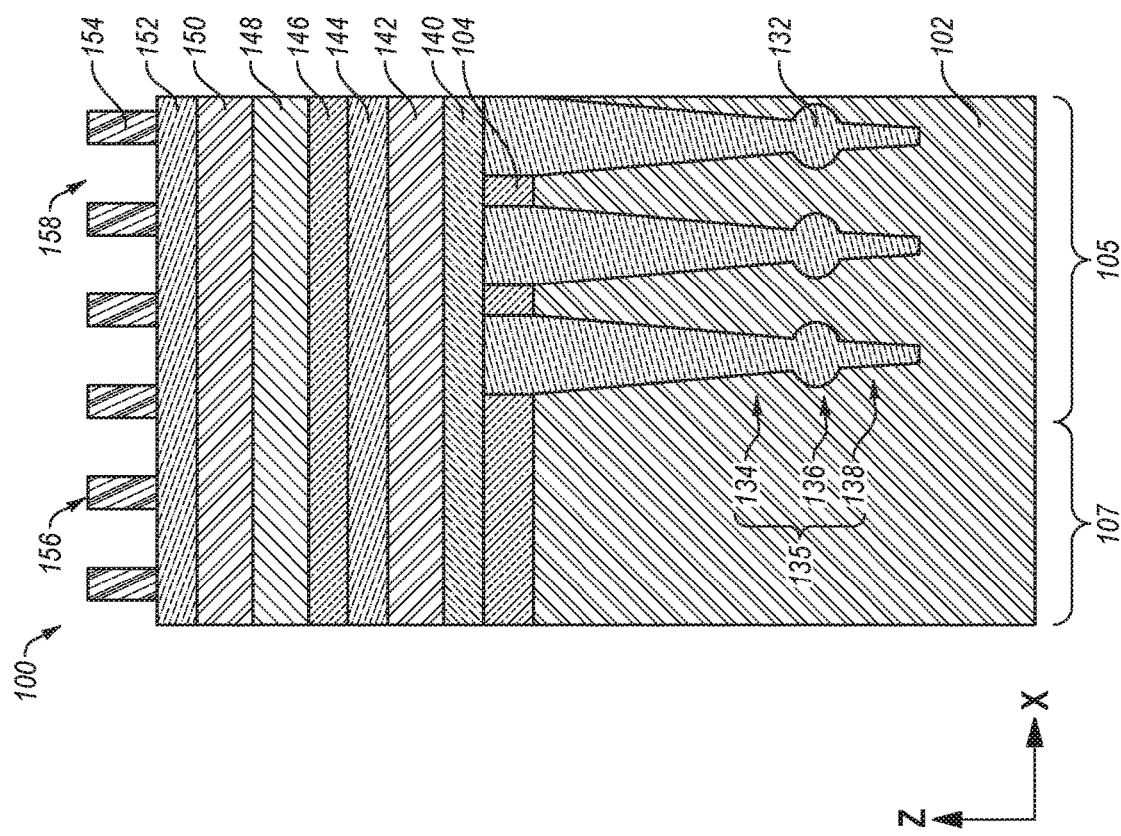

MICROELECTRONIC DEVICES INCLUDING PASSING WORD LINE STRUCTURES, AND RELATED ELECTRONIC SYSTEMS AND METHODS

TECHNICAL FIELD

The disclosure, in various embodiments, relates generally to the field of microelectronic device design and fabrication. More specifically, the disclosure relates to methods of forming microelectronic devices, and to related microelectronic devices and electronic systems.

BACKGROUND

Conventional volatile memory cells, such as dynamic random access memory (DRAM) cells, may include a memory storage element and a transistor. The memory storage element may, for example, include a capacitor (e.g., sometimes referred to as a "cell capacitor" or a "storage capacitor") configured to store a logical state (e.g., a binary value of either a "0" or a "1") defined by the stored charge in the capacitor. The transistor may be referred to in the art as an "access transistor." The transistor conventionally includes a channel region between a pair of source/drain regions and further includes a gate configured to electrically connect the source/drain regions to one another through the channel region. The channel region conventionally includes a semiconductor material, such as silicon.

To charge, discharge, read, or recharge the capacitor, the transistor may be selectively turned to an "on" state, in which current flows between the source region and the drain region through the channel region of the transistor. Application of a voltage greater than a threshold voltage ($V_t$) to the gate induces an inversion layer in the channel region, inducing a current flow between the drain region and the source region. The transistor may be selectively turned to an "off" state, in which the flow of current is substantially stopped.

In the off state, it is desirable for the capacitor associated with the transistor to retain a stored charge, without change (e.g., leakage thereof), through the transistor. However, conventional volatile memory cells may exhibit discharges of current over time and a resulting loss in stored charge. Therefore, even in the "off" state where the source region and the drain region of the associated transistor are electrically isolated (e.g., when an inversion layer is not present in the channel region) and the memory cell is unselected (e.g., not selected), current may leak from the capacitor through the transistor. This off-state current is referred to in the art as sub-threshold leakage current. The undesirable leakage of charge from the capacitor requires the capacitor to be constantly refreshed (e.g., recharged) to maintain the logic state of the memory cell. However, refreshing the charge on the capacitor increases the power consumption of the microelectronic device associated with the memory cell.

In addition to maintaining a low refresh rate, it is desirable to reduce an amount that an unselected memory cell is disturbed when a voltage is applied to a passing word line (e.g., a word line that is not electrically coupled to the unselected memory cell, but located proximate (e.g., adjacent) to the unselected memory cell). In some instances, application of a voltage to a word line adjacent an unselected memory cell may induce leakage of current or change from the capacitor associated with the unselected memory cell through the drain of the unselected memory cell. The leakage may increase a required refresh rate of the unselected memory cell and affect performance of the microelectronic device.

DETAILED DESCRIPTION

Figure 1B:
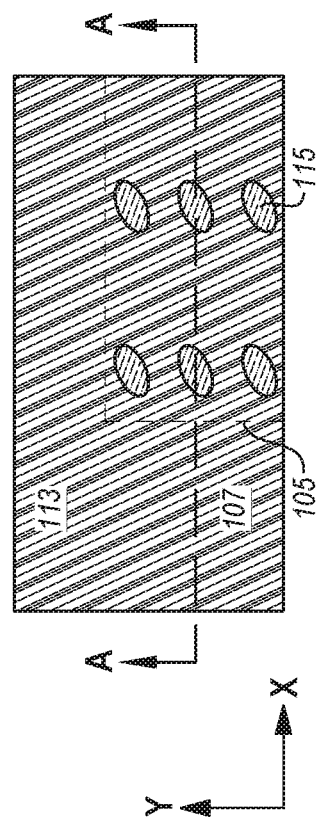
FIG. 1A through FIG. 1Z are simplified cross-sectional views (FIG. 1A, FIG. 1C, FIG. 1E, FIG. 1G through FIG. 1L, FIG. 1N, FIG. 1P through FIG. 1R, FIG. 1U, FIG. 1V, and FIG. 1X through FIG. 1Z) and top view (FIG. 1B, FIG. 1D, FIG. 1F, FIG. 1M, FIG. 1O, FIG. 1S, FIG. 1T, and FIG. 1W) illustrating a method of forming a microelectronic device, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as DRAM memory device), apparatus, or electronic system, or a complete microelectronic device, apparatus, or electronic system. The structures described below do not form a complete microelectronic device, apparatus, or electronic system. Only those process acts and structures necessary to understand the embodiments described herein are described in detail below. Additional acts to form a complete microelectronic device, apparatus, or electronic system from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessary limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x-$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x,"

"y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device includes active word line structures and passing word line structures, which may be recessed within a semiconductive material. The active word line structures may comprise a portion of a memory cell including the active word line structure, an access device (e.g., a transistor), and a storage structure (e.g., a capacitor) coupled to the access device by the active word line structure. A passing word line structure may be located adjacent to the active word line structure. In some embodiments, the passing word line structure may be coupled to another storage structure at a location distal from the memory cell coupled to the active word line structure. The passing word line structure may be formed over and at least partially within an isolation structure including an insulative material configured to reduce leakage of charge (e.g., current) form the storage structure of the memory cell coupled to the active word line structure during application of a voltage to the passing word line structure.

In some embodiments, the microelectronic device includes pillars of the semiconductive material between adjacent passing word line structures, the pillars extending from a base portion of the semiconductive material. Active word line structures may be located between the adjacent passing word line structures. In some embodiments, pillars adjacent the passing word line structures may have a dimension (e.g., a diameter, a width, a thickness) less than a corresponding dimension of pillars that are not located adjacent a passing word line structure (e.g., pillars located adjacent to only the active word line structures). A dielectric material (e.g., a gate dielectric) of the passing word line structure may be located adjacent to an insulative material and the passing word line structure may include a dielectric material having an effective thickness greater than a thickness of a corresponding dielectric material of the active word line structures. The greater effective thickness of the dielectric material of the passing word line structure may reduce a leakage of charge from an unselected storage structure that is adjacent to a passing word line structure to which a voltage has been applied. The reduction in the charge leakage from the storage structure may improve performance of the microelectronic device, such as by increasing the amount of time between refresh operations of the memory cells associated with the storage structures.

Figure 1A:
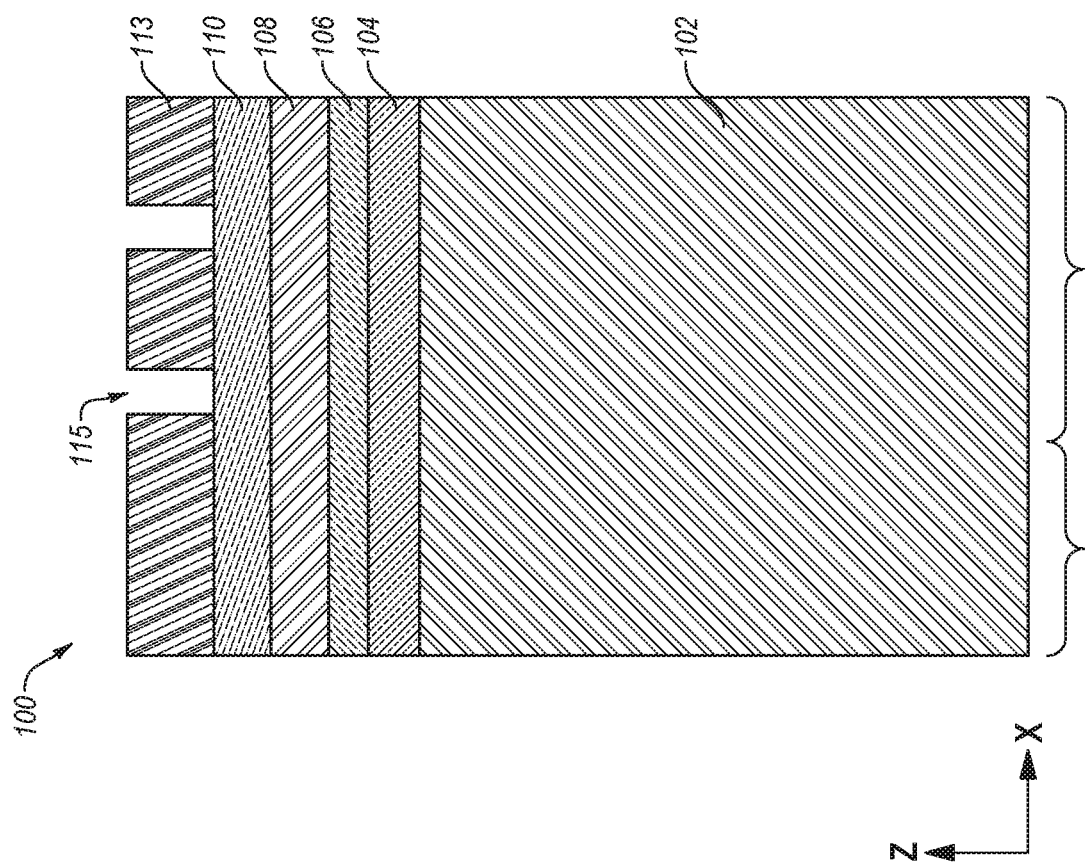
Figure 1D:
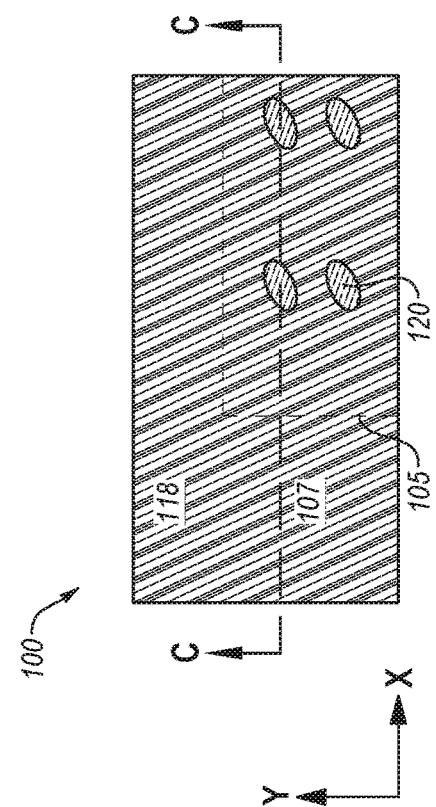
Figure 1C:
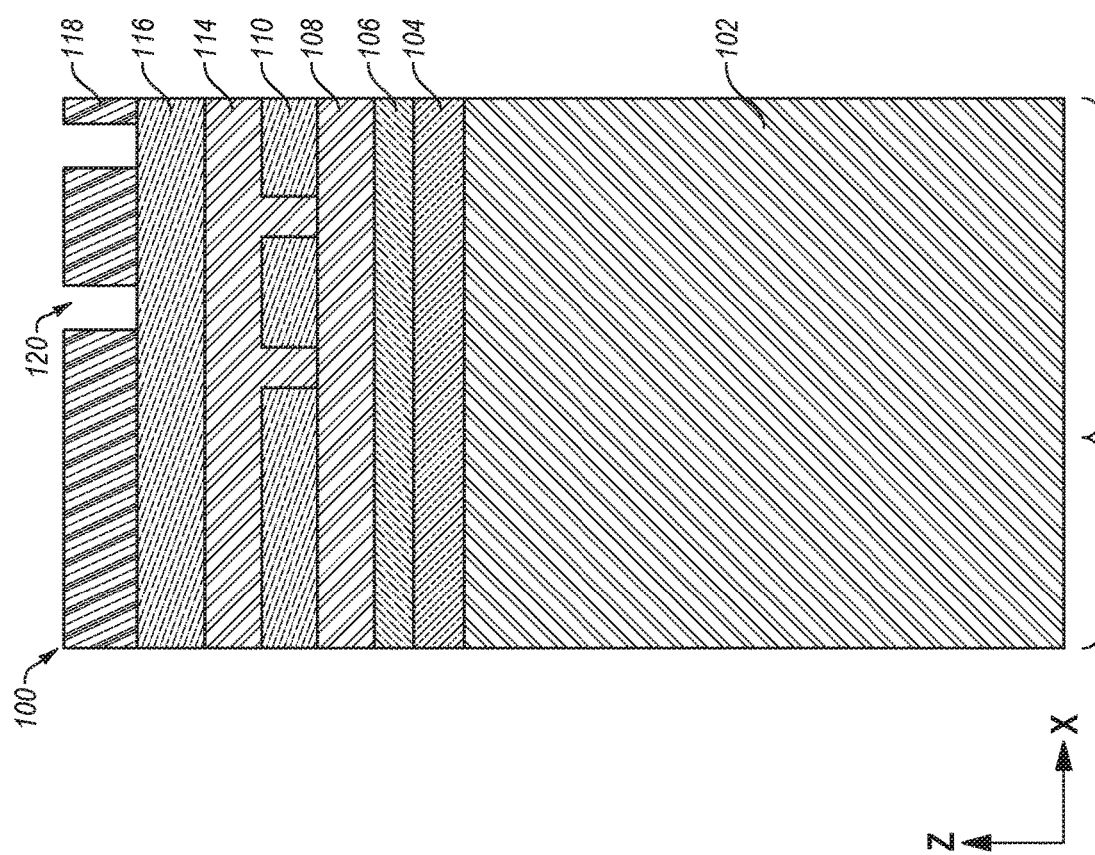
Figure 1H:
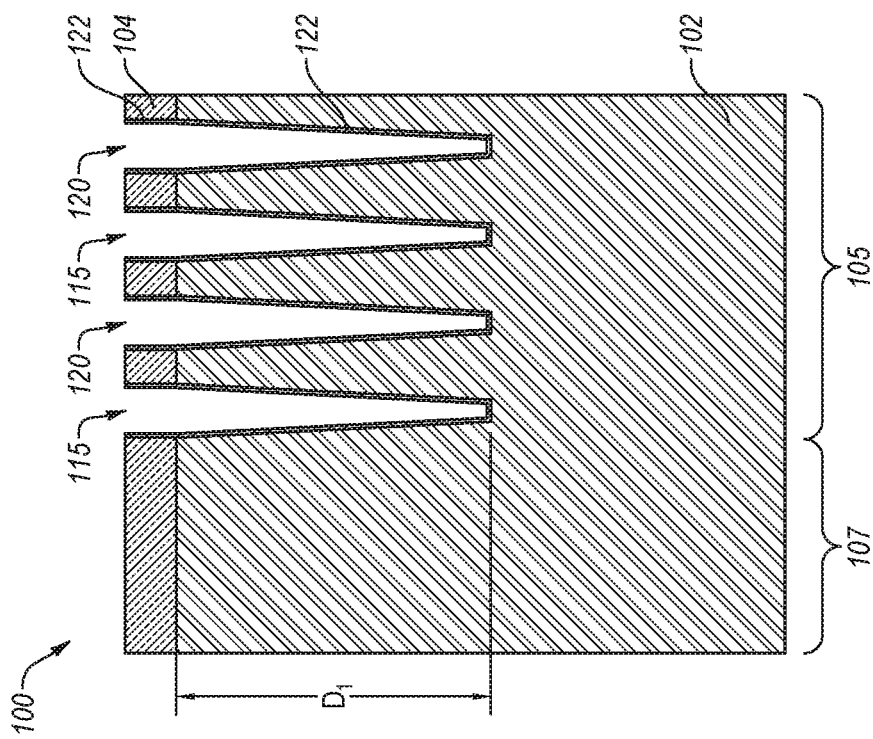
Figure 1G:
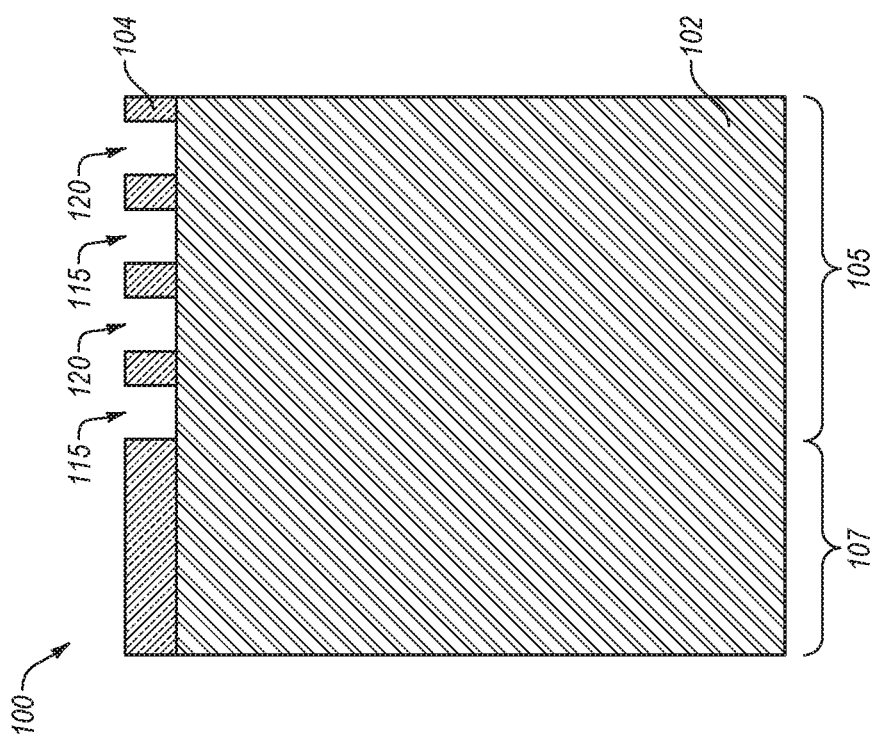
Figure 1I:
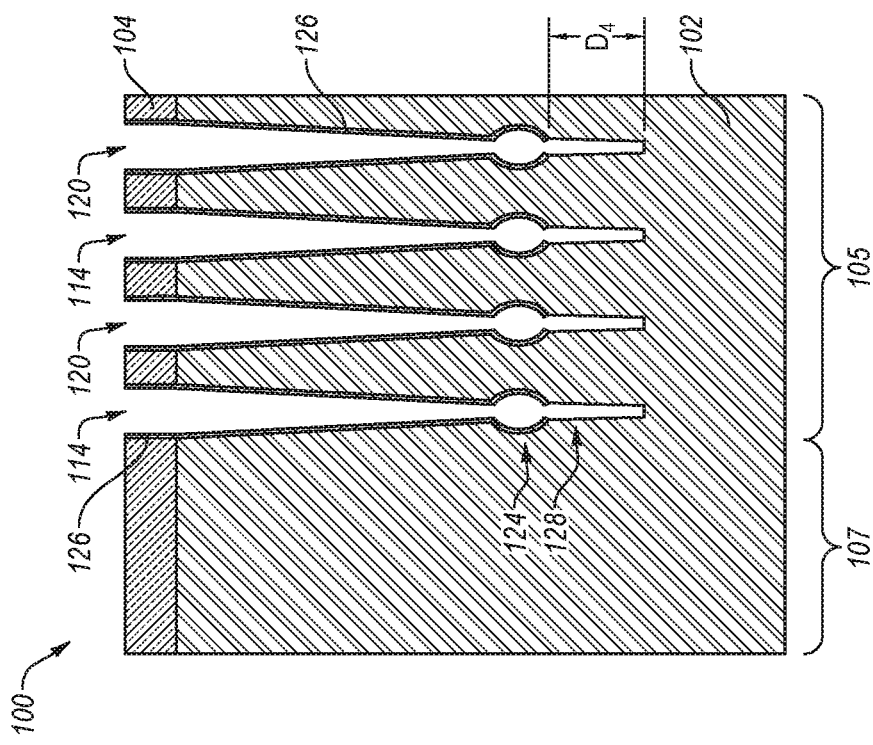
Figure 1J:
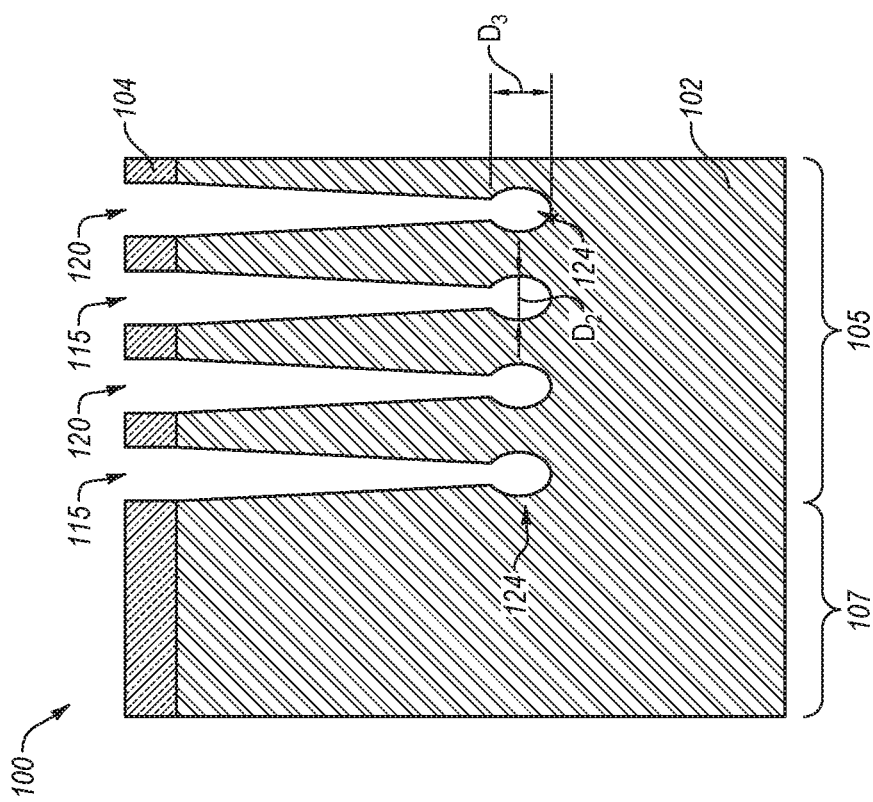
Figure 1M:
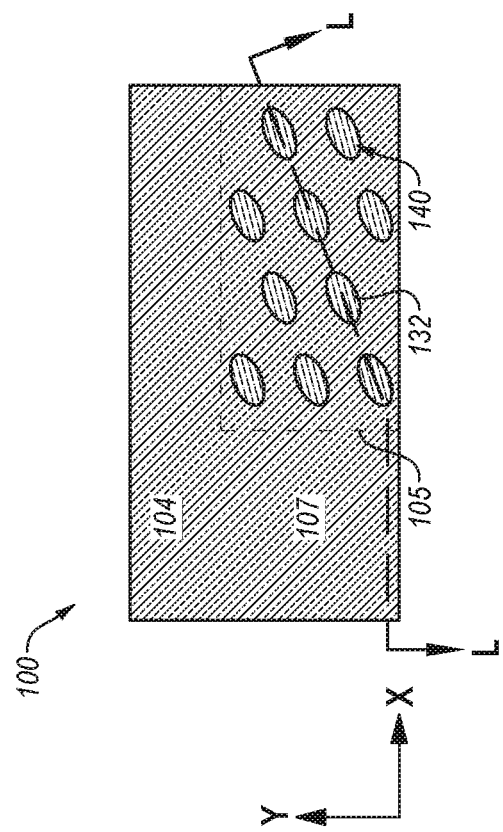
Figure 1L:
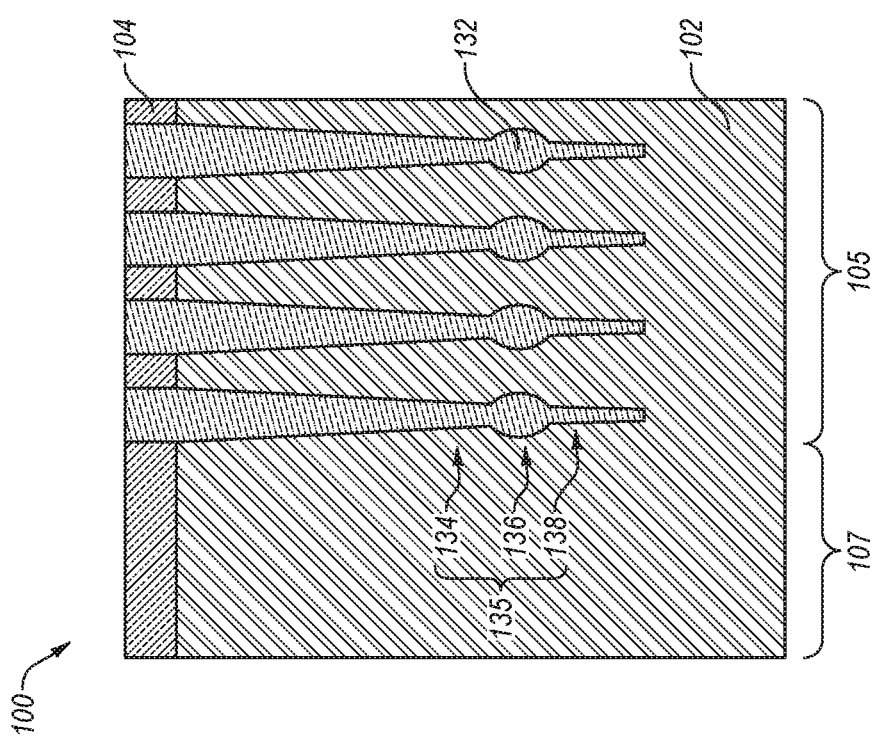
Figure 1Q:
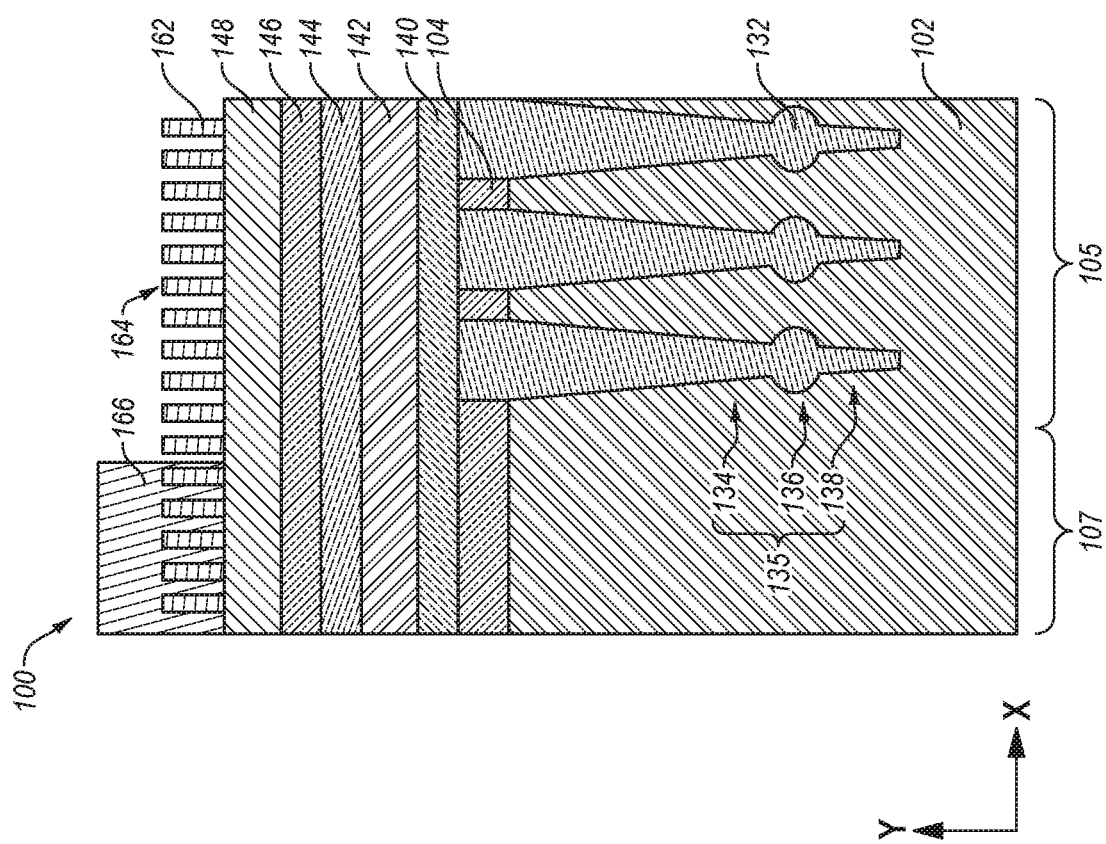
Figure 1P:
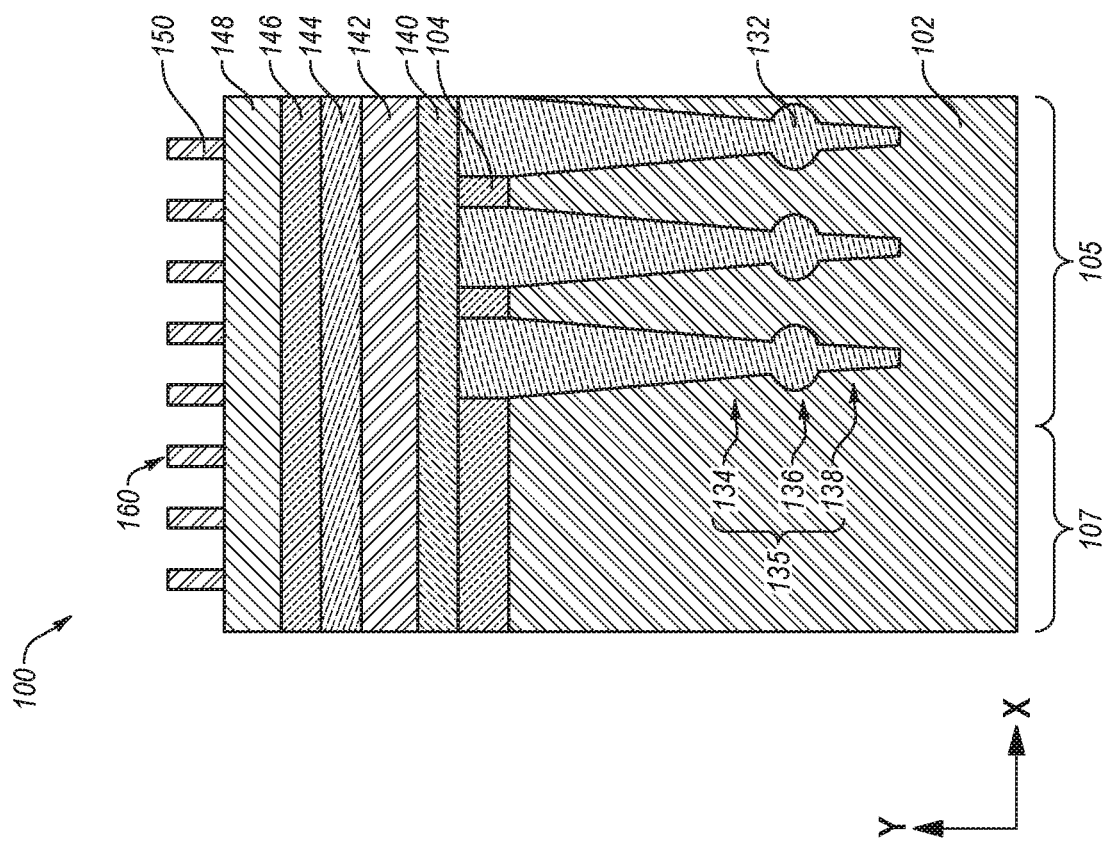
Figure 1S:
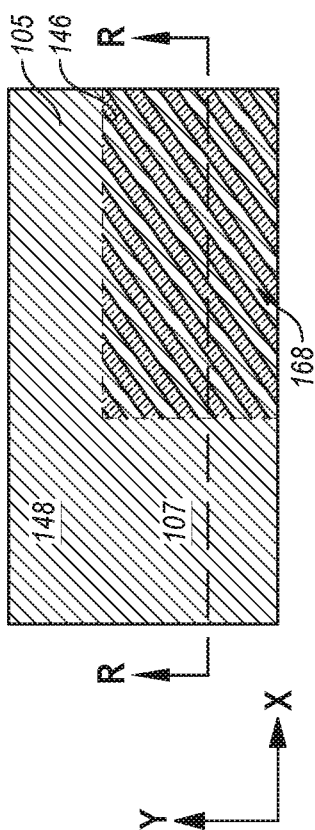
Figure 1R:
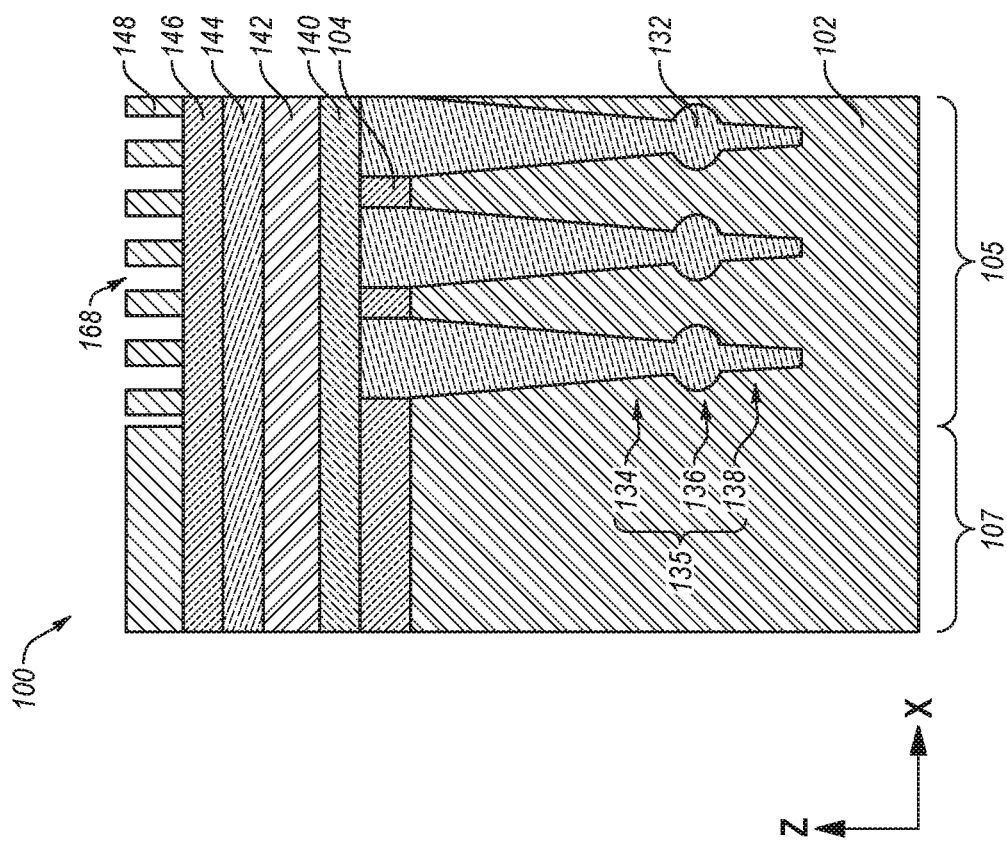
Figure 1U:
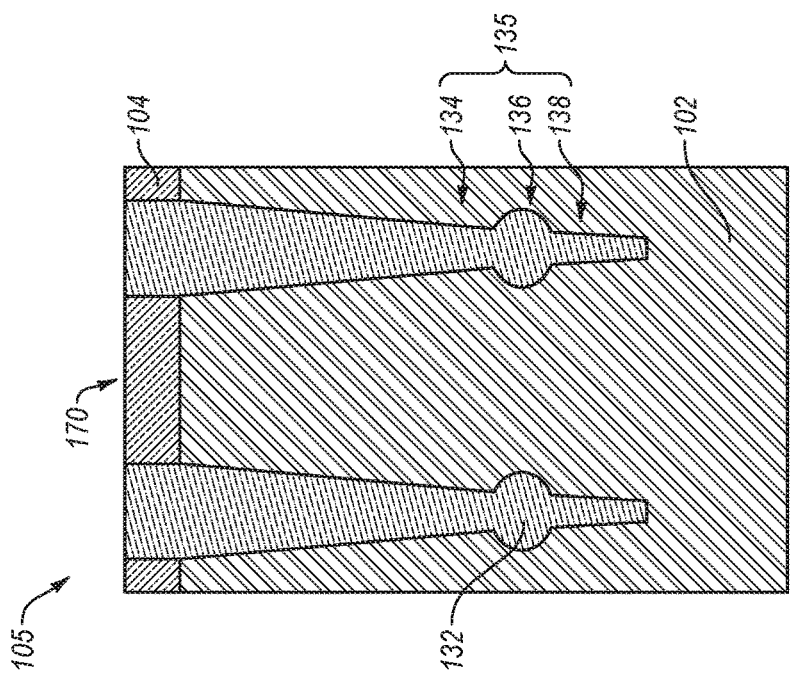
Figure 1T:
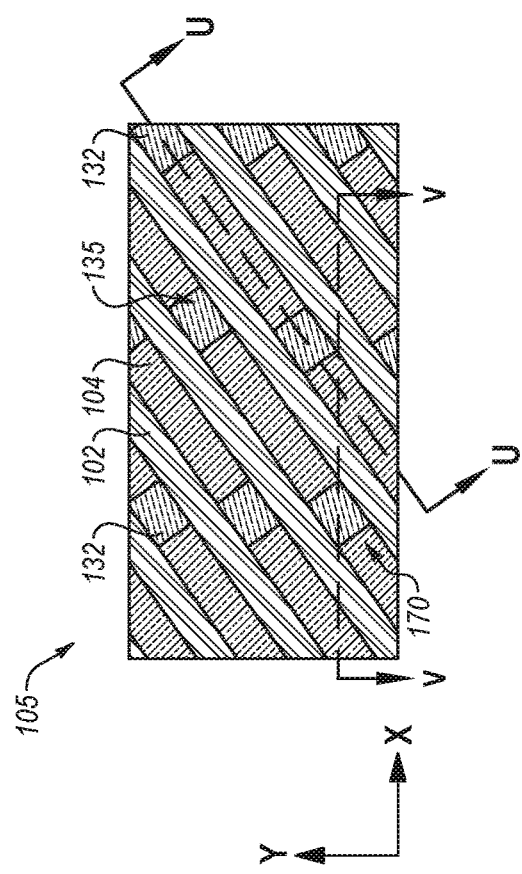
Figure 1V:
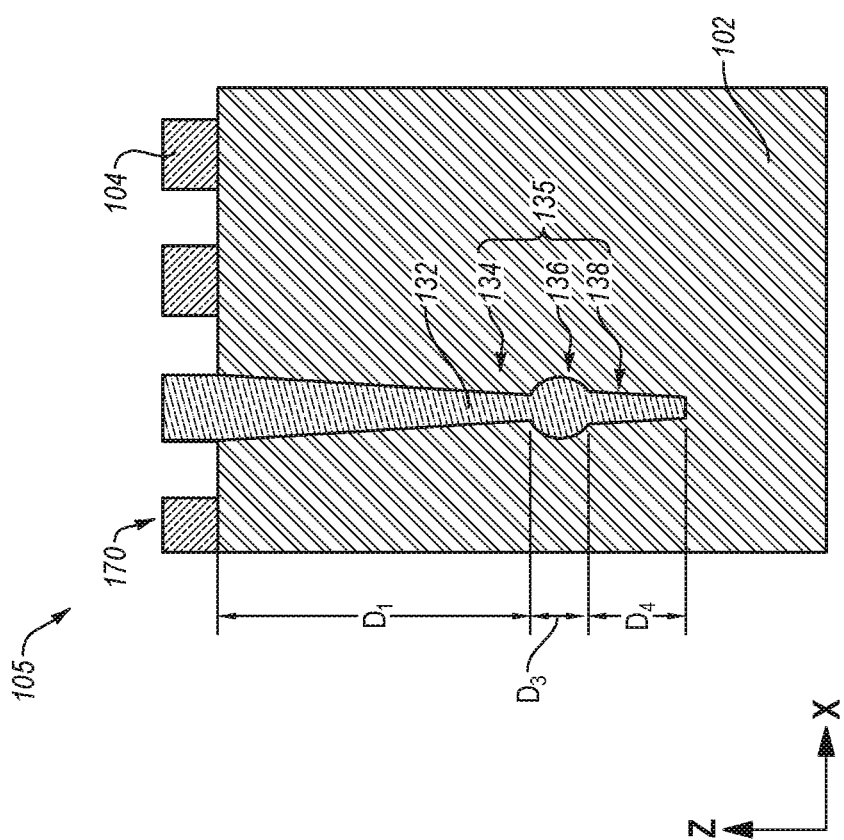
Figure 1X:
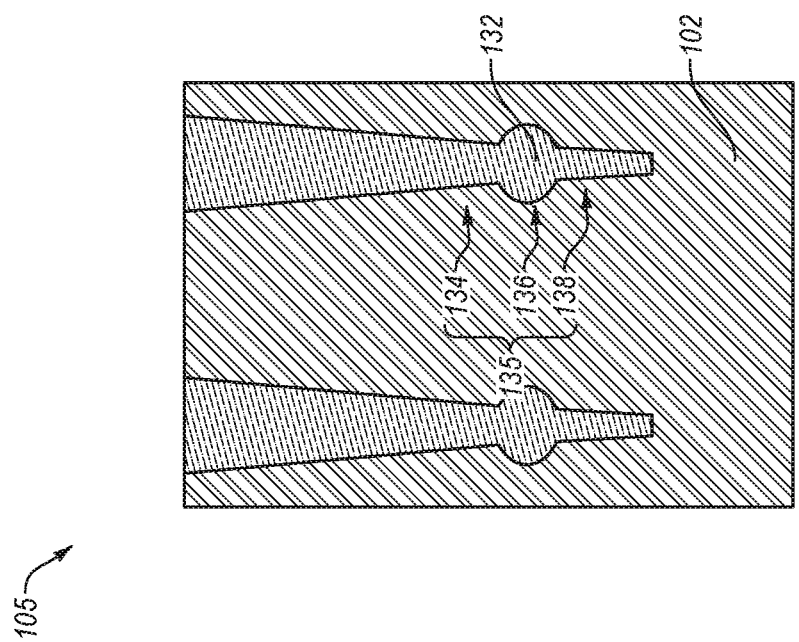
Figure 1W:
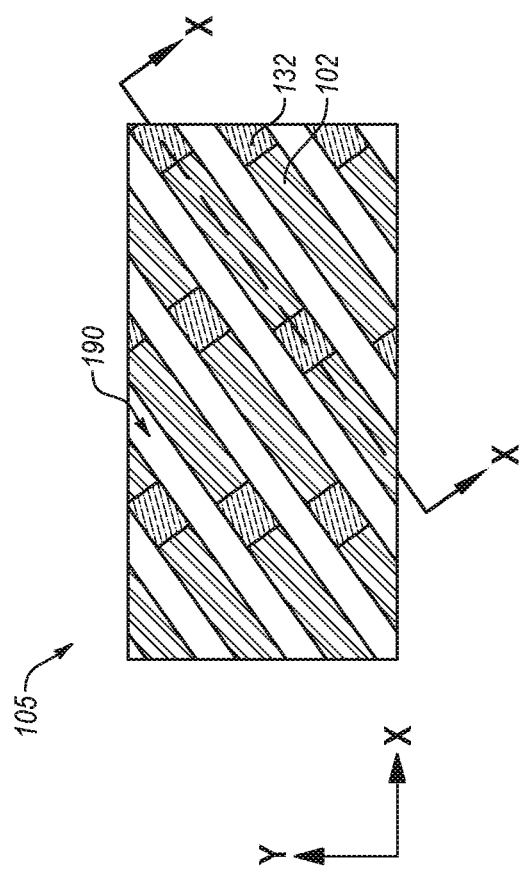
Figure 1Z:
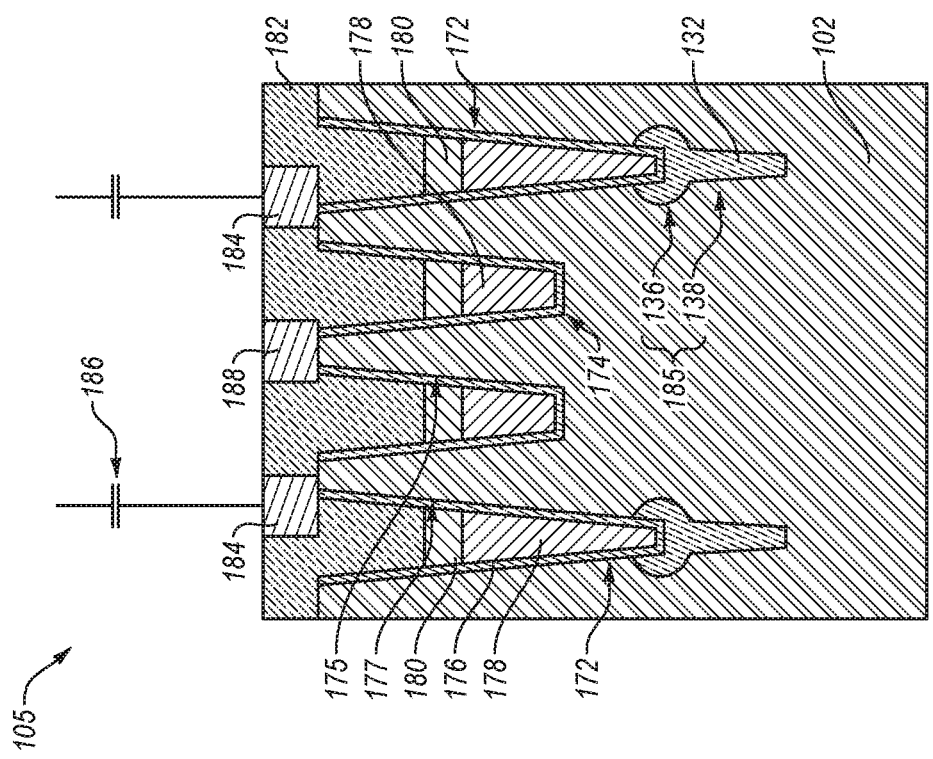

FIG. 1A through FIG. 1Z are simplified partial cross-sectional views and top views illustrating embodiments of a method of forming a microelectronic device, in accordance with embodiments of the disclosure. FIG. 1A is a simplified cross-sectional view of a microelectronic device 100 taken through section line A-A of FIG. 1B, which is a top view of the microelectronic device 100 of FIG. 1A.

With reference to FIG. 1A and FIG. 1B, the microelectronic device 100 may include a base material 102, a first oxide material 104 vertically overlying (e.g., in the Z-direction) the base material 102, a first nitride material 106 vertically overlying the first oxide material 104, a first carbon-containing material 108 vertically overlying the first nitride material 106, a first dielectric anti-reflective coating (DARC) material 110 vertically overlying the first carbon-containing material 108, and a first photoresist material 113 vertically overlying the first DARC material 110.

The first photoresist material 113 may be patterned to include openings 115 therein, portions of the first DARC material 110 exposed through the openings 115. In some embodiments, the openings 115 are formed in an array region 105 of the microelectronic device 100 and are not formed in a peripheral region 107 of the microelectronic device 100. The array region 105 may include regions of the microelectronic device 100 including active circuitry and memory cells (e.g., arrays of memory cells). Although FIG. 1B illustrates only six openings 115 in the array region 105, it will be understood that the microelectronic device 100 may include more openings 115 (e.g., thousands of openings 115) and that only six openings 115 are illustrated for ease of understanding the disclosure.

The openings 115 may have a substantially elliptical shape, a rectangular shape, or another shape. In some embodiments, the openings 115 have an elliptical shape.

The base material 102 may include a semiconductor substrate, a base semiconductor material on a supporting substrate, a metal electrode, or a semiconductor substrate having one or more materials, structures, or regions formed thereon. The base material 102 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base material" in the following description, previous process stages may have been utilized to form material, regions, or junctions in the base semiconductor structure or foundation. The base material 102 may include one or more materials associated with integrated circuitry fabrication. Such materials may include, for example, one or more of refractory metals, barrier materials, diffusion materials, and insulative materials. The base material 102 may include, for example, complementary metal oxide semiconductor (CMOS) structures, or other semiconductor structures. Different portions of the base material 102 may be electrically isolated from each other by one or more dielectric materials.

The first oxide material 104 may be formed of and include one or more dielectric materials, such as, for example, one or more of silicon dioxide ($SiO_2$), fluorosilicate glass (FSG), phosphosilicate glass (PSG), borosilicate glass (BSG), borophosphosilicate glass (BPSG), and another insulative material. The first oxide material 104 may be formed by thermal oxidation of the base material 102, deposition (e.g., deposition with, for example, tetraethyl orthosilicate (TEOS)), or another method. In some embodiments, the first oxide material 104 comprises silicon dioxide.

The first nitride material 106 may be formed of and include one or more of silicon nitride ($Si_3N_4$), silicon oxynitride ($SiO_xN_y$), or another material. In some embodiments, the first nitride material 106 comprises silicon nitride.

The first carbon-containing material 108 may be formed of and include a carbon-containing mask material. In some embodiments, the first carbon-containing material 108 comprises amorphous hydrogenated carbon (also referred to as "amorphous carbon"). In some embodiments, the first carbon-containing material 108 comprises a spin-on carbon (SOC) material.

The first DARC material 110 may be formed of and include a silicon oxynitride material, such as $Si_xO_yN_z$, wherein x is between about 10 and about 60, y is between about 20 and about 50, and z is between about 10 and about 20. However, the disclosure is not so limited and the first DARC material 110 may include other suitable DARC materials that may be known in the art. The first DARC material 110 may be formulated and configured to substantially prevent reflection of electromagnetic radiation (e.g., a light source) during exposure of a photoresist material (e.g., the first photoresist material 113) during patterning of the photoresist material.

The first photoresist material 113 may be formed of and include a 193 nanometer (nm) photoresist material, a 248 nm photoresist material, or a photoresist material sensitive to radiation of a different wavelength. The first photoresist material 113 may be a positive or a negative photoresist material, a photopolymeric photoresist material, a photodecomposing photoresist material, or a photocrosslinking photoresist material. Photoresist materials, such as positive and negative resists, are known in the art and, therefore, are not described in detail herein. As discussed above, openings 115 may be formed within the first photoresist material 113 within the array region 105.

FIG. 1D is a top view of the microelectronic device 100 of FIG. 1C, which is a cross-sectional view of the microelectronic device 100 taken through section line C-C of FIG. 1D. With reference to FIG. 1C, after forming the openings 115 in the first photoresist material 113, the openings 115 may be transferred to the first DARC material 110, followed by removal of the first photoresist material 113 (FIG. 1A). After removing the first photoresist material 113, a second carbon-containing material 114 may be formed over the first DARC material 110 and a second DARC material 116 may be formed over the second carbon-containing material 114. With reference to FIG. 1C, the second carbon-containing material 114 may fill the openings 115 (FIG. 1A) within the first DARC material 110.

The second carbon-containing material 114 may be formed of and include one or more of the materials described above with reference to the first carbon-containing material 108 and the second DARC material 116 may be formed of and include one or more of the materials described above with reference to the first DARC material 110. In some embodiments, the second carbon-containing material 114 comprises the same material composition as the first carbon-containing material 108. In some embodiments, the second DARC material 116 comprises the same material composition as the first DARC material 110.

A second photoresist material 118 may be formed over the second DARC material 116. The second photoresist material 118 may include one or more of the materials described above with reference to the first photoresist material 113. In some embodiments, the second photoresist material 118 comprises the same material composition as the first photoresist material 113.

Openings 120 may be formed in the second photoresist material 118 to expose a portion of the second DARC material 116. The openings 120 may be formed in the array region 105 and may not be formed in the peripheral region 107. In some embodiments, the openings 120 are laterally offset (e.g., in the X-direction and in the Y-direction) from the openings 115 (FIG. 1B).

Referring now to FIG. 1E and FIG. 1F, the openings 120 in second photoresist material 118 may be transferred to the second DARC material 116 and the second photoresist material 118 may be removed (e.g., stripped) from the second DARC material 116. After forming the openings 120 in the second DARC material 116, the openings 120 may be transferred to the second carbon-containing material 114. For example, the openings 120 may be formed in the second carbon-containing material 114 by exposing the second carbon-containing material 114 to a plasma etch including one or more of HBr, $Cl_2$, carbon tetrafluoride ($CF_4$), or another material.

With continued reference to FIG. 1E, after forming the openings 120 in the second carbon-containing material 114 (FIG. 1C), the pattern of the openings 120 may be transferred from the second carbon-containing material 114 to the first DARC material 110 and the second carbon-containing material 114 may be removed. Accordingly, the first DARC material 110 may include the openings 115 and the openings 120, which may be laterally offset (e.g., in the X-direction and in the Y-direction) from the openings 115, as illustrated in FIG. 1F, which is a top view of the microelectronic device 100 of FIG. 1E. With reference to FIG. 1E, the openings 115 may be aligned with other openings 115 in the lateral direction (e.g., in each of the X-direction and the Z-direction) and may be laterally offset (e.g., in each of the X-direction and the Y-direction) from each of the openings 120. Similarly, the openings 120 may be aligned with other openings 120 in the lateral direction (e.g., in each of the X-direction and the Z-direction) and may be laterally offset (e.g., in each of the X-direction and the Y-direction) from each of the openings 115. One or more openings 115 may laterally intervene (e.g., in the X-direction, in the Y-direction) between adjacent ones of the openings 120 and one or more openings 120 may laterally intervene (e.g., in the X-direction, in the Y-direction) between adjacent ones of the openings 115.

Although FIG. 1E and FIG. 1F illustrate a particular spacing between adjacent openings 115, 120, the disclosure is not so limited. It will be understood that the spacing between the openings 115, 120 may be different than (e.g., greater than) that illustrated, but, for ease of understanding the description the openings 115, 120 are illustrated with a particular spacing.

FIG. 1G illustrates the same cross-sectional view of the microelectronic device 100 as that illustrated in FIG. 1E. With reference to FIG. 1G, the pattern of openings 115, 120 within the first DARC material 110 (FIG. 1E) may be transferred to the first oxide material 104. For example, the openings 115, 120 may be formed through the first carbon-containing material 108 (FIG. 1E). In some embodiments, the first DARC material 110 is removed after forming the openings in the first carbon-containing material 108. The openings 115, 120 may be transferred through the first nitride material 106 (FIG. 1E) and subsequently transferred to the first oxide material 104, as illustrated in FIG. 1G. With reference to FIG. 1G, portions of the base material 102 may be exposed though the openings 115, 120 in the first oxide material 104.

With reference to FIG. 1H, which illustrates the same cross-section illustrated in FIG. 1G, the base material 102 may be patterned through the openings 115, 120 in the first oxide material 104 to extend the openings 115, 120 into the base material 102. By way of non-limiting example, the openings 115, 120 may be transferred to the base material 102 by exposing the base material 102 to a wet etchant, such as one or more of potassium hydroxide (KOH), sodium hydroxide (NaOH), tetramethylammonium hydroxide (TMAH), or another material. In some embodiments, the base material 102 is anisotropically etched to form the openings 115, 120 therein.

A depth $D_1$ of the openings 115, 120 into the base material 102 may be within a range from about 100 nm to about 180 nm, such as from about 100 nm to about 120 nm, from about 120 nm to about 140 nm, from about 140 nm to about 160 nm, or from about 160 nm to about 180 nm. However, the disclosure is not so limited and the depth $D_1$ may be different than those described above.

After forming the openings 115, 120 in the base material 102, a first liner material 122 may be formed over the microelectronic device 100. In some embodiments, the first liner material 122 is substantially conformally formed over the microelectronic device 100. The first liner material 122 may be formed of and include a nitride material, such as, for example, silicon nitride, a metal nitride (e.g., titanium nitride, tungsten nitride, tantalum nitride, aluminum nitride), an oxynitride material, a silicon carboxynitride material, or another material. In some embodiments, the first liner material 122 comprises silicon nitride. In some embodiments, the first liner material 122 comprises the same material composition as the first nitride material 106 (FIG. 1A).

With continued reference to FIG. 1H, laterally extending portions (e.g., in the X-direction, in the Y-direction) of the first liner material 122 may be removed from the microelectronic device 100 (e.g., from the first oxide material 104 and from the base material 102 within the openings 115, 120). By way of non-limiting example, the first liner material 122 may be exposed to a dry etchant such as one or more of sulfur hexafluoride ($SF_6$), nitrogen trifluoride ($NF_3$), oxygen ($O_2$), difluorocarbene ($CF_2$), $CF_4$, trifluoromethane ($CHF_3$) (also referred to as fluoroform), difluoromethane ($CH_2F_2$), methyl fluoride ($CH_3F$) (also referred to as fluoromethane), hexafluoromethane ($C_2F_6$), perfluoropropane ($C_3F_8$), octafluorocyclobutane ($C_4F_8$), perfluorocyclopentene ($C_5F_8$), and another material to remove the laterally extending portions of the first liner material 122.

Referring now to FIG. 1I, which illustrates the same cross-section as FIG. 1H, isotropic openings 124 (which may also be referred to as "pockets") may be formed in the base material 102. The isotropic openings 124 may have a dimension $D_2$ (e.g., diameter) within a range from about 10 nm to about 40 nm, such as from about 10 nm to about 20 nm, from about 20 nm to about 30 nm, or from about 30 nm to about 40 nm. In some embodiments, the dimension $D_2$ is from about 30 nm to about 40 nm, such as from about 35 nm to about 40 nm. In some embodiments, the dimension $D_2$ is about 40 nm.

A depth $D_3$ of the isotropic openings 124 from a surface of the may be within a range from about 10 nm to about 40 nm, as described above with reference to the dimension $D_2$.

The isotropic openings 124 may be formed by isotropically etching the base material 102 through the openings 115, 120. By way of non-limiting example, the base material 102 may be exposed to one or more of nitric acid, hydrochloric acid, and acetic acid.

After forming the isotropic openings 124, the first liner material 122 (FIG. 1H) may be removed from surfaces of the first oxide material 104 and the base material 102. In some embodiments, the first liner material 122 is exposed to a wet etchant, such as one or both of nitric acid and phosphoric acid ($H_3PO_4$).

With reference to FIG. 1J, which illustrates the same cross-section as FIG. 1I, a second liner material 126 may be formed over the microelectronic device 100. In some embodiments, the second liner material 126 is formed substantially conformally over the microelectronic device 100 and within the openings 115, 120, including over surfaces of the isotropic openings 124. The second liner material 126 may include one or more of the materials described above with reference to the first liner material 122. In some embodiments, the second liner material 126 comprises silicon nitride. In some embodiments, the second liner material 126 comprises the same material composition as the first liner material 122.

After forming the second liner material 126, laterally extending (e.g., the X-direction, in the Y-direction) portions of the second liner material 126 may be removed, as described above with reference to the first liner material 122. For example, the laterally extending portions of the second liner material 126 may be removed from laterally extending surfaces of the first oxide material 104 and from a lower portion of the isotropic openings 124. The laterally extending portions of the second liner material 126 may be removed by exposing the microelectronic device 100 to a dry etchant such as one or more of $SF_6$, $NF_3$, $O_2$, $CF_2$, $CF_4$, $CHF_3$, $CH_2F_2$, $CH_3F$, $C_2F_6$, $C_3F_8$, $C_4F_8$, and $C_5F_8$.

Removing the laterally extending portions of the second liner material 126 may expose the base material 102 at the lower portions of the isotropic openings 124. With continued reference to FIG. 1J, the base material 102 at the lower portions of the isotropic openings 124 may be exposed to one or more materials to remove the base material 102 and form vertically extending portions 128 of the openings 115, 120. By way of non-limiting example, the base material 102 may be exposed to a dry etchant including one or more of $SF_6$, one or more fluorocarbons (e.g., carbon tetrafluoride ($CF_4$), difluorocarbene ($CF_2$), trifluoromethane ($CHF_3$) (also referred to as fluoroform), difluoromethane ($CH_2F_2$), methyl fluoride ($CH_3F$) (also referred to as fluoromethane), hexafluoromethane ($C_2F_6$), perfluoropropane ($C_3F_8$), octafluorocyclobutane ($C_4F_8$), and perfluorocyclopentene ($C_5F_8$)) to form the vertically extending portions 128.

A depth $D_4$ of the base material 102 removed below the isotropic openings 124 may be within a range from about 10 nm to about 25 nm, such as from about 10 nm to about 15 nm, from about 15 nm to about 20 nm, or from about 20 nm to about 25 nm. However, the disclosure is not so limited and the depth $D_4$ may be different than those described.

FIG. 1K illustrates the same cross-section of the microelectronic device 100 as FIG. 1J. Referring to FIG. 1K, the second liner material 126 may be removed from within the openings 115, 120 and a protective material 130 may be formed over exposed surfaces of the base material 102. In some embodiments, the second liner material 126 is removed by exposing the second liner material 126 to a wet etchant comprising, for example, one or both of nitric acid and phosphoric acid ($H_3PO_4$), as described above with reference to removal of the first liner material 122 (FIG. 1I).

The protective material 130 may be formed by epitaxial growth from the base material 102. By way of non-limiting example, in some embodiments, the base material 102 comprises silicon and the protective material 130 comprises polysilicon grown from exposed portions of the base material 102. The protective material 130 may not be formed on (e.g., grown on) exposed portions of the first oxide material 104.

With reference to FIG. 1L and FIG. 1M, an insulative material 132 may be formed within the openings 115, 120 (FIG. 1K) and may substantially fill the openings 115, 120 to form isolation structures 135 (which may also be referred to herein as "insulative structures") extending into the base material 102. After forming the insulative material 132, the microelectronic device 100 may be exposed to a chemical mechanical planarization (CMP) process to remove the insulative material 132 from portions outside of the openings 115, 120. FIG. 1L is a cross-sectional view of the microelectronic device 100 of FIG. 1M taken through section line L-L of FIG. 1M.

The insulative material 132 may be formed of and include a spin on dielectric (SOD) material such as, for example, one or more of silicon dioxide, polyimide, a polynorborene, benzocyclobutene, polytetraethylene (PTFE), hydrogen silsesquioxane (HSQ), BSG, PSG, BPSG, or another material. In some embodiments, the insulative material 132 is formed by applying a spin on dielectric material and exposing the spin on dielectric material to curing conditions (e.g., exposing the spin on dielectric material to a suitable temperature (e.g., such as a rapid thermal annealing (RTA)) process) to densify the spin on dielectric material and form the insulative material 132. In some embodiments, densifying the spin on dielectric material may convert the protective material 130 to an oxide (e.g., silicon dioxide), which may form a portion of the insulative material 132. In other embodiments, the insulative material 132 comprises aluminum oxide.

The isolation structures 135 may include a shallow trench isolation (STI) structure including a first portion 134 extending from a surface of the base material 102 to a second portion 136 vertically underlying (e.g., in the Z-direction) the first portion 134; and a third portion 138 vertically underlying (e.g., in the Z-direction) the second portion 136. The second portion 136 may comprise an arcuate portion including curved surfaces in each of, for example, the X-Z plane and the Y-Z plane and may also be referred to as a "pocket region" of the isolation structures 135. A cross-sectional shape of the second portion 136 in the X-Z plane may be substantially circular, substantially elliptical, substantially oval, or another shape. In other embodiments, a cross-sectional shape of the second portion 136 in the X-Z plane is substantially circular. In some embodiments, a cross-sectional shape of the second portion 136 in the Y-Z plane is substantially the same as the cross-sectional shape of the second portion 136 in the X-Y plane. In some embodiments, a dimension of the second portion 136 in the X-Z plane may be different than a dimension of the second portion 136 in the Y-Z plane.

In some embodiments, the second portion 136 includes laterally extending pockets extending farther in the X-direction and the Y-direction than the first portion 134 or the third portion 138 of the isolation structures 135. In some embodiments, sidewalls of the first portion 134 and sidewalls of the third portion 138 may be tapered. For example, an upper portion of the first portion 134 may have a larger cross-sectional area than a lower portion of the first portion 134.

Similarly, an upper portion of the third portion 138 may have a larger cross-sectional area than a lower portion of the third portion 138.

FIG. 1O is a top view of the microelectronic device 100 of FIG. 1N, which is a simplified cross-sectional view of the microelectronic device 100 taken through section line N-N of FIG. 1O. With reference to FIG. 1N, since the cross-section of FIG. 1N is taken through the X-Z plane, it will be understood that the spacing between adjacent isolation structures 135 may be different than that illustrated in the cross-section of FIG. 1L.

With reference to FIG. 1N, a second nitride material 140 may be formed vertically over (e.g., in the Z-direction) the first oxide material 104, a third carbon-containing material 142 may be formed vertically over the second nitride material 140, a third DARC material 144 may be formed vertically over the third carbon-containing material 142, a second oxide material 146 may be formed vertically over the third DARC material 144, a polysilicon material 148 may be formed vertically over the second oxide material 146, a fourth carbon-containing material 150 may be formed vertically over the polysilicon material 148, and a fourth DARC material 152 may be formed vertically over the fourth carbon-containing material 150.

The second nitride material 140 may be formed of and include one or more of the materials described above with reference to the first nitride material 106 (FIG. 1A). In some embodiments, the second nitride material 140 comprises silicon nitride.

The third carbon-containing material 142 and the fourth carbon-containing material 150 may each individually be formed of and include one or more of the materials described above with reference to the first carbon-containing material 108 (FIG. 1A). In some embodiments, the third carbon-containing material 142 and the fourth carbon-containing material 150 each comprise amorphous carbon. In some embodiments, the third carbon-containing material 142 comprises the same material composition as the fourth carbon-containing material 150.

The third DARC material 144 and the fourth DARC material 152 may each individually be formed of and include one or more of the materials described above with reference to the first DARC material 110 (FIG. 1A). In some embodiments, the third DARC material 144 and the fourth DARC material 152 each comprise silicon oxynitride. In some embodiments, the third DARC material 144 comprises the same material composition as the fourth DARC material 152.

The second oxide material 146 may be formed of and include one or more of the materials described above with reference to the first oxide material 104. In some embodiments, the second oxide material 146 comprises silicon dioxide. In some embodiments, the second oxide material 146 comprises the same material composition as the first oxide material 104.

With continued reference to FIG. 1N and FIG. 1O, a third photoresist material 154 may be formed and patterned vertically over (e.g., in the Z-direction) the fourth DARC material 152. The third photoresist material 154 may be formed of and include one or more of the materials described above with reference to the first photoresist material 113 (FIG. 1A).

With reference to FIG. 1O, the third photoresist material 154 may be patterned into lines 156, each of which may be separated from one or more adjacent lines 156 by spaces 158. The lines 156 of the third photoresist material 154 may extend at an angle with reference to the X-axis and the Y-axis. For example, the lines 156 may extend at an angle within a range from about 30° to about 60° with respect to the X-axis. However, the disclosure is not so limited and the lines 156 may extend at an angle with respect to the X-axis different than those described above.

Referring now to FIG. 1P, the pattern of the lines 156 (FIG. 1O) of the third photoresist material 154 (FIG. 1P, FIG. 1O) may be exposed to a pitch doubling process to form a pattern of lines 160 of the fourth carbon-containing material 150. By way of non-limiting example, spacers may be formed on sidewalls of the lines 156 of the third photoresist material 154 and the third photoresist material 154 may be removed (e.g., stripped) from surfaces of the fourth carbon-containing material 150. The spacers may be used as a mask to pattern and transfer the pattern of the spacers to the fourth carbon-containing material 150, as illustrated in FIG. 1P.

With reference to FIG. 1Q, the lines 160 (FIG. 1P) of the fourth carbon-containing material 150 (FIG. 1P) may be exposed to another pitch doubling process to form lines 164 of a third oxide material 162. For example, spacers comprising the third oxide material 162 may be formed on sidewalls of the lines 160 of the fourth carbon-containing material 150 and the lines 160 of the fourth carbon-containing material 150 may be selectively removed relative to the 164 of the third oxide material 162. After forming the lines 164 of the third oxide material 162, a fourth photoresist material 166 may be formed over the peripheral region 107 of the microelectronic device 100 and the lines 164 of the third oxide material 162 may remain exposed in the array region 105.

With reference to FIG. 1R and FIG. 1S, the pattern of lines 164 (FIG. 1Q) of the third oxide material 162 (FIG. 1Q) may be transferred to the polysilicon material 148 to form lines 168 of the polysilicon material 148. FIG. 1S is a top view of the microelectronic device 00 of FIG. 1R, which illustrates the cross-section of the microelectronic device 100 taken through section line R-R of FIG. 1S. The lines 168 of the polysilicon material 148 may be formed by, for example, exposing the polysilicon material 148 to one or more dry etchants, such as, for example, one or more of $Cl_2$, HBr, $O_2$, $CF_4$, $C_2F_6$, carbon tetrafluoride ($CCl_4$), or another material.

FIG. 1T is a simplified top view of a portion of the array region 105 after transferring the pattern of the lines 168 (FIG. 1R, FIG. 1S) of the polysilicon material 148 (FIG. 1R, FIG. 1S) to the first oxide material 104. FIG. 1U is a simplified cross-sectional view of the array region 105 taken through section line U-U of FIG. 1T and FIG. 1V is a simplified cross-sectional view of the array region taken through section line V-V of FIG. 1T. For ease of understand of the description, only a portion of the array region 105 is illustrated in FIG. 1S through FIG. 1U. The cross-section of FIG. 1T is the same as that illustrated in FIG. 1F and FIG. 1M.

Transferring the pattern of the lines 168 (FIG. 1R, FIG. 1S) of the polysilicon material 148 (FIG. 1R, FIG. 1S) to the first oxide material 104 may include forming lines 170 of the first oxide material 104 extending between the isolation structures 135. The insulative material 132 and first oxide material 104 may be removed from regions in between adjacent lines 170 of the first oxide material 104 to expose the base material 102. By way of non-limiting example, the pattern of the lines 168 may be transferred to the second oxide material 146, followed by removal of the polysilicon material 148. Thereafter, the pattern may be transferred from the second oxide material 146 to the second nitride material 140, as known in the art. The pattern may subsequently be transferred from the second nitride material 140 to the first oxide material 104. For example, the pattern of the second nitride material 140 may be used as a mask while patterning the first oxide material 104. Methods of transferring a pattern are known in the art and are not described in detail herein.

FIG. 1W is a top view of the array region 105 after removing the first oxide material 104 (FIG. 1T) and removing at least a portion of the base material 102 between adjacent lines 170 (FIG. 1T) of the first oxide material 104 to form trenches 190 in the base material 102. For example, from about 250 nm to about 300 nm of the base material 102 may be removed between adjacent lines 170. It will be understood that lower portions of the trenches 190 may be defined by the base material 102, but the base material 102 is not illustrated under the trenches 190 in the view of FIG. 1W for each of understanding the description. FIG. 1X is a simplified cross-sectional view of the array region 105 taken through section line X-X of FIG. 1W. Removal of the first oxide material 104 may expose the base material 102 and a portion of the isolation structures 135.

Figure 1Y:
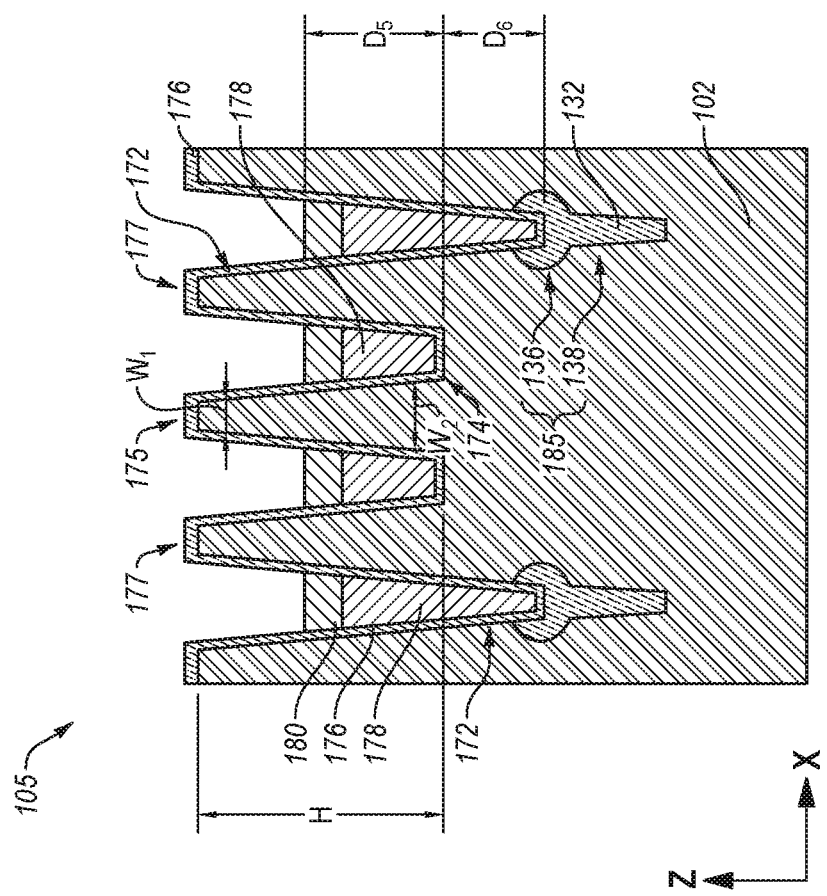

Referring now to FIG. 1Y, the microelectronic device 100 may be exposed to various fabrication acts to form the microelectronic device 100 of FIG. 1Y. The cross-sectional view of FIG. 1Y illustrates the same cross-section of the microelectronic device 100 as that illustrated in FIG. 1X. For example, the isolation structures 135 (FIG. 1X) may be patterned to form passing word line structures 172 and the base material 102 between adjacent isolation structures 135 may be patterned to form active word line structures 174.

The passing word line structures 172 and the active word line structures 174 may be formed by, for example, removing portions of the insulative material 132 of the isolation structures 135 (FIG. 1X) and removing portions of the base material 102 between adjacent isolation structures 135. In some embodiments, the insulative material 132 is removed at a faster rate than the base material 102. In some such embodiments, a depth of the passing word line structures 172 may be greater than a depth of the active word line structures 174. In some embodiments, at least a portion of the second portion 136 of the isolation structures 135 is removed.

In some embodiments, a depth of the passing word line structures 172 is greater than a depth $D_5$ of the active word line structures 174. The depth $D_5$ of the active word line structures 174 may be within a range from about 40 nm to about 90 nm, such as from about 40 nm to about 50 nm, from about 50 nm to about 70 nm, or from about 70 nm to about 90 nm. A depth $D_6$ of the passing word line structure 172 that extend below a lower portion of the active word line structures 174 may be within a range from about 5 nm to about 35 nm, such as from about 5 nm to about 15 nm, from about 15 nm to about 25 nm, or from about 25 nm to about 35 nm. However, the disclosure is not so limited and the depths $D_5$, $D_6$ may be different than those described.

Removing portions of the base material 102 between adjacent isolation structures 135 during formation of the passing word line structures 172 and the active word line structures 174 may include forming pillars extending from the base material 102. For example, the pillars may include first pillars 175 between the active word line structures 174 and second pillars 177 located adjacent to a passing word line structure 172 (e.g., between a passing word line structure 172 and an active word line structure 174).

The first pillars 175 and the second pillars 177 may each individually comprise the same material composition as the base material 102. In some embodiments, at least a portion of the first pillars 175 and the second pillars 177 comprises one or more dopants. By way of non-limiting example, the first pillars 175 may comprise a source region of a transistor and the second pillars 177 may comprise a drain region of a transistor. The first pillars 175 may be doped with at least one N-type dopant (e.g., arsenic ions, phosphorous ions, antimony ions) and the second pillars 177 may be doped with at least one P-type dopant (e.g., boron ions).

A height H of the first pillars 175 and the second pillars 177 may be within a range from about 100 nm to about 150 nm, such as from about 100 nm to about 125 nm, or from about 125 nm to about 150 nm. However, the disclosure is not so limited and the height may be different than those described.

In some embodiments, sidewalls of the first pillars 175 and the second pillars 177 are tapered (e.g., angled). In some such embodiments, a width of the first pillars 175 and the second pillars 177 may be upper portions of the respective first pillars 175 and the second pillars 177 than lower portions thereof. For example, a width $W_1$ of upper portions of the first pillars 175 and the second pillars 177 may be within a range from about 10 nm to about 15 nm, such as from about 10 nm to about 12.5 nm, or from about 12.5 nm to about 20 nm. A width $W_2$ of lower portions of the first pillars 175 and the second pillars 177 may be within a range from about 12.5 nm to about 17.5 nm, such as from about 12.5 nm to about 15.0 nm, or from about 15.0 to about 17.5 nm. However, the disclosure is not so limited and the widths $W_1$, $W_2$ may be different than those described.

With continued reference to FIG. 1Y, after removing the portions of the base material 102 and forming the first pillars 175 and the second pillars 177, a dielectric material 176 (e.g., a gate oxide material, a gate dielectric material) may be formed over surfaces of the base material 102.

The dielectric material 176 may be formed of and include one or more of silicon dioxide, silicon oxynitride, phosphosilicate glass, borosilicate glass, borophosphosilicate glass (BPSG), fluorosilicate glass, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another gate dielectric material, a dielectric carbon nitride material (e.g., silicon carbon nitride (SiCN)), a dielectric carboxynitride material (e.g., silicon carboxynitride (SiOCN)), or combinations thereof. In some embodiments, the dielectric material 176 comprises silicon dioxide.

In some embodiments, the dielectric material 176 is formed by epitaxial growth from the base material 102 and from exposed surfaces of the insulative material 132. In some such embodiments, the epitaxially grown dielectric material 176 may be exposed to oxygen to form an oxide (e.g., silicon dioxide). In other embodiments, the dielectric material 176 is formed by deposition (e.g., one or more of ALD, PVD, CVD, LPCVD, PECVD). Although FIG. 1Y illustrates that the dielectric material 176 extends laterally (e.g., in the X-direction, in the Y-direction) between the first electrode material 178 and the insulative material 132 of the second portion 136, the disclosure is not so limited. In other embodiments, the dielectric material 172 may terminate within the insulative material 132.

After forming the dielectric material 176, a first electrode material (e.g., a first gate electrode material) 178 may be formed over the dielectric material 176. The first electrode material 178 may be formed of and include a conductive material. In some embodiments, the first electrode material 178 comprises titanium nitride.

A second electrode material 180 may be formed over the first gate electrode material 178 and adjacent to the dielectric material 176. The second electrode material 180 may be formed of and include a conductive material. For example, the second electrode material 180 may be formed of and include one or more of the materials described above with reference to the first electrode material 178. In some embodiments, the second electrode material 180 comprises polysilicon.

The first electrode material 178 and the second electrode material 180 of each of the passing word line structures 172 and the active word line structures 174 may be formed vertically below (e.g., in the Z-direction) the upper portions of the first pillars 175 and the second pillars 177. Since the first electrode material 178 and the second electrode material 180 of the active word line structures 174 are formed below upper portions of the first pillars 175 and the second pillars 177, the active word line structures 174 may be referred to herein as "recessed access devices" (RADs).

With continued reference to FIG. 1Y, the passing word line structures 172 may be formed over and at least partially within isolation structures 185 that include at least some of the second portion 136 and the third portion 138 of the insulative material 132. By way of comparison, the active word line structures 174 may not be formed directly above or within the isolation structure 185.

In some embodiments, the second portion 136 of the isolation structures 185 may extend laterally (e.g., in the X-direction, in the Y-direction) below the active word line structures 174. Stated another way, in some such embodiments, at least a portion of the insulative material 132 of the isolation structures 185 (e.g., the second portion 136) may extend laterally directly below the active word line structures 174.

As discussed above, the second portion 136 of the isolation structures 185 may be substantially circular, substantially elliptical, substantially oval, or another shape. In some embodiments, the second portion 136 may include portions extending laterally farther (e.g., in the X-direction, in the Y-direction) than other portions of the isolation structures 185.

Referring now to FIG. 1Z, an insulative material 182 may be formed over the second electrode material 180 within regions between the first pillars 175 and the second pillars 177 and over the microelectronic device 100 (e.g., over the first pillars 175 and the second pillars 177). The insulative material 182 may be formed of and include one or more dielectric materials. In some embodiments, the insulative material 182 comprises a different material composition than the dielectric material 176. In some embodiments, the insulative material 182 comprises silicon nitride.

Openings may be formed within the insulative material 182 over the second pillars 177 and filled with a conductive material 184, which may comprise a conductive contact in electrical communication with a storage structure 186 (e.g., a memory storage structure, such as a capacitor).

Openings may be formed within the insulative material 182 directly over the first pillars 175 and may be filled with a conductive material 188. The conductive material 188 may be in electrical communication with a conductive access line, such as a digit line or a bit line.

Forming the passing word line structures 172 within the isolation structures 185 may facilitate improved performance of the microelectronic device 100. For example, the second portion 136 of the isolation structure 185 may include laterally extending (e.g., in the X-direction, in the Y-direction) that reduces the so-called passing word line disturb of memory cells associated with the storage structures 186 when an adjacent passing word line structure 172 is exposed to a voltage (e.g., to access a memory cell to which the passing word line is operably coupled). In some embodiments, the passing word line disturb may be about 15 percent less than the passing word line disturb compared to a conventional microelectronic device without substantially affecting the drain current.

Figure 2:
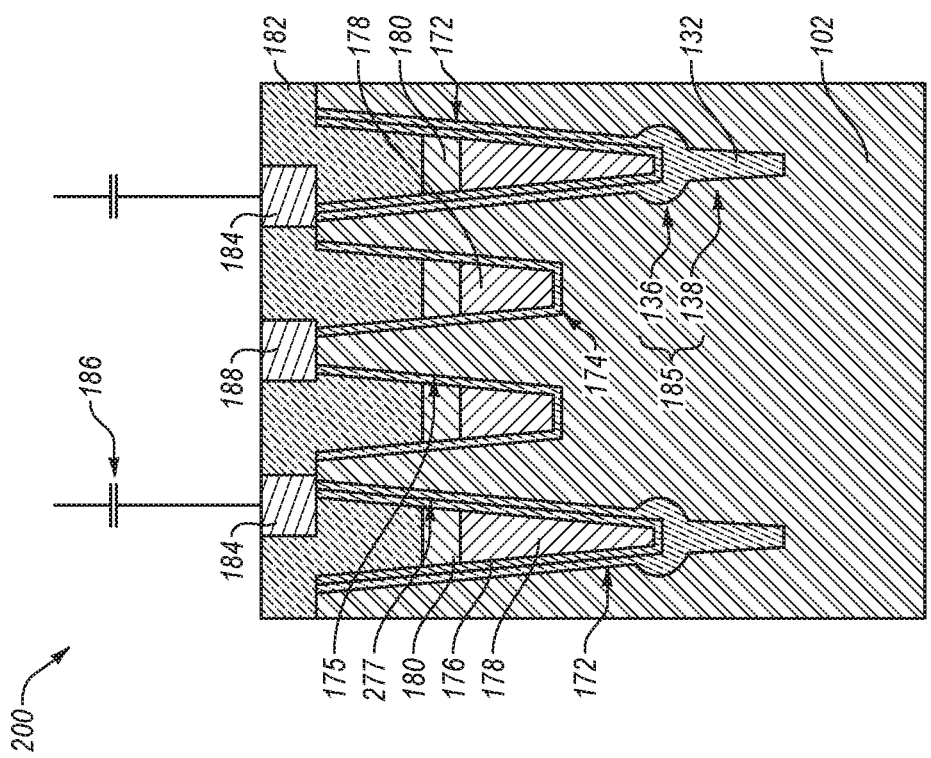
FIG. 2 is a simplified cross-sectional view of a microelectronic device, in accordance with embodiments of the disclosure.

Although FIG. 1A through FIG. 1Z have been described and illustrated as forming a microelectronic device 100 having a particular structure, the disclosure is not so limited. FIG. 2 is a simplified cross-sectional view of a microelectronic device 200, in accordance with embodiments of the disclosure. The microelectronic device 200 may be substantially similar to the microelectronic device 100 of FIG. 1Z, except that the microelectronic device 200 may include a second pillars 277 having a narrower dimension than the second pillars 177 of the microelectronic device 100. The first pillars 175 have substantially the same dimensions as the first pillars 175 of the microelectronic device 100.

The microelectronic device 200 may be formed in substantially the same manner as the microelectronic device 100 of FIG. 1Z, except that the microelectronic device 100 of FIG. 1E and FIG. 1F may be exposed to a trimming process to thin the portions of the first DARC material 110 between the openings 115 and the openings 120. In other words, the microelectronic device of FIG. 1E and FIG. 1F may be processed to increase the lateral dimension of the openings 115, 120. The fabrication of the microelectronic device 100 may proceed in substantially the same manner as described above with reference to FIG. 1G through FIG. 1Z to form the microelectronic device 200. Since the openings 115, 120 are formed to have a larger lateral dimension, with reference to FIG. 2, portions of the insulative material 132 may remain during formation of the passing word line structures 172. For example, the dielectric material 176 of the passing word line structures 172 may be formed adjacent to (e.g., laterally adjacent to) portions of the insulative material 132 and the insulative material 132 may be located between the base material 102 and the dielectric material 176. The insulative material 132 extending along the dielectric material 176 may effectively increase the thickness of the dielectric material 176 of the passing word line structures 172.

The microelectronic device 200 may exhibit a reduction in gate induced drain leakage (GIDL) compared to conventional microelectronic devices that do not include the insulative material 132 extending along the dielectric material 176. It is believed that the insulative material 132 in combination with the dielectric material 176 may reduce an amount of leakage from the storage structures 186 through the second pillars 277 without substantially affecting the current through the second pillars 277 during accessing of the storage structure 186 when a voltage is applied to the active word line structures 174.

Thus, in accordance with embodiments of the disclosure a microelectronic device comprises a first pillar of a semiconductive material, a second pillar of the semiconductive material adjacent to the first pillar of the semiconductive material, an active word line extending between the first pillar and the second pillar, and a passing word line extending on a side of the second pillar opposite the active word line, the passing word line extending into an isolation region within the semiconductive material, the isolation region comprising a lower portion and an upper portion having a substantially circular cross-sectional shape and a larger lateral dimension than the lower portion.

Thus, in accordance with additional embodiments of the disclosure, a microelectronic device comprises a first pillar of a semiconductive material, second pillars of a semiconductive material adjacent to the first pillar of the semiconductive material, the second pillars having a smaller lateral dimension than the first pillar, a first electrode structure between the first pillar and each of the second pillars, and second electrode structures on a side of the second pillars opposite the first electrode structures.

Thus in accordance with further embodiments of the disclosure, a method of forming a microelectronic device comprises forming isolation structures in a semiconductive material. Forming the isolation structures comprises forming a first pattern of openings in a material, forming a second pattern of openings laterally offset from the first pattern of openings in the material, transferring the first pattern of openings and the second pattern of openings to a base material, and filling the openings in the base material with an insulative material. The method further comprises removing a portion of the insulative material to form openings above the isolation structures, forming a dielectric material within the openings, and forming a conductive material adjacent the dielectric material.

Figure 3:
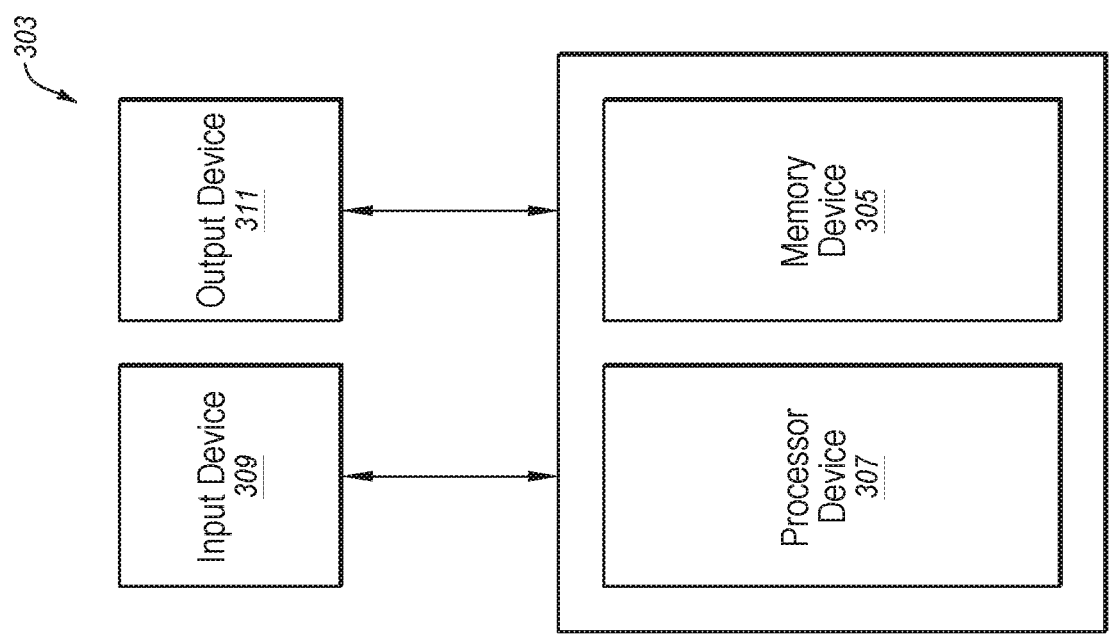
FIG. 3 is a block diagram of an electronic system, in accordance with embodiments of the disclosure.

Microelectronic devices including microelectronic devices (e.g., the microelectronic device 100, 200) including the passing word line structures 172 comprising the isolation structures 185 and/or including the effectively thickness dielectric material (e.g., the dielectric material 176 adjacent to the insulative material 132), according embodiments of the disclosure may be used in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 303 includes at least one memory device 305. The memory device 305 may include, for example, an embodiment of a microelectronic device structure previously described herein or a microelectronic device (e.g., the microelectronic device 100, 200) previously described with reference to FIG. 1A through FIG. 1Z, and FIG. 2, including the including the passing word line structures 172.

The electronic system 303 may further include at least one electronic signal processor device 307 (often referred to as a "microprocessor"). The electronic signal processor device 307 may, optionally, include an embodiment of a microelectronic device or a microelectronic device structure previously described herein (e.g., one or more of the microelectronic device 100, 200 previously described with reference to FIG. 1A through FIG. 1Z and FIG. 2). The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
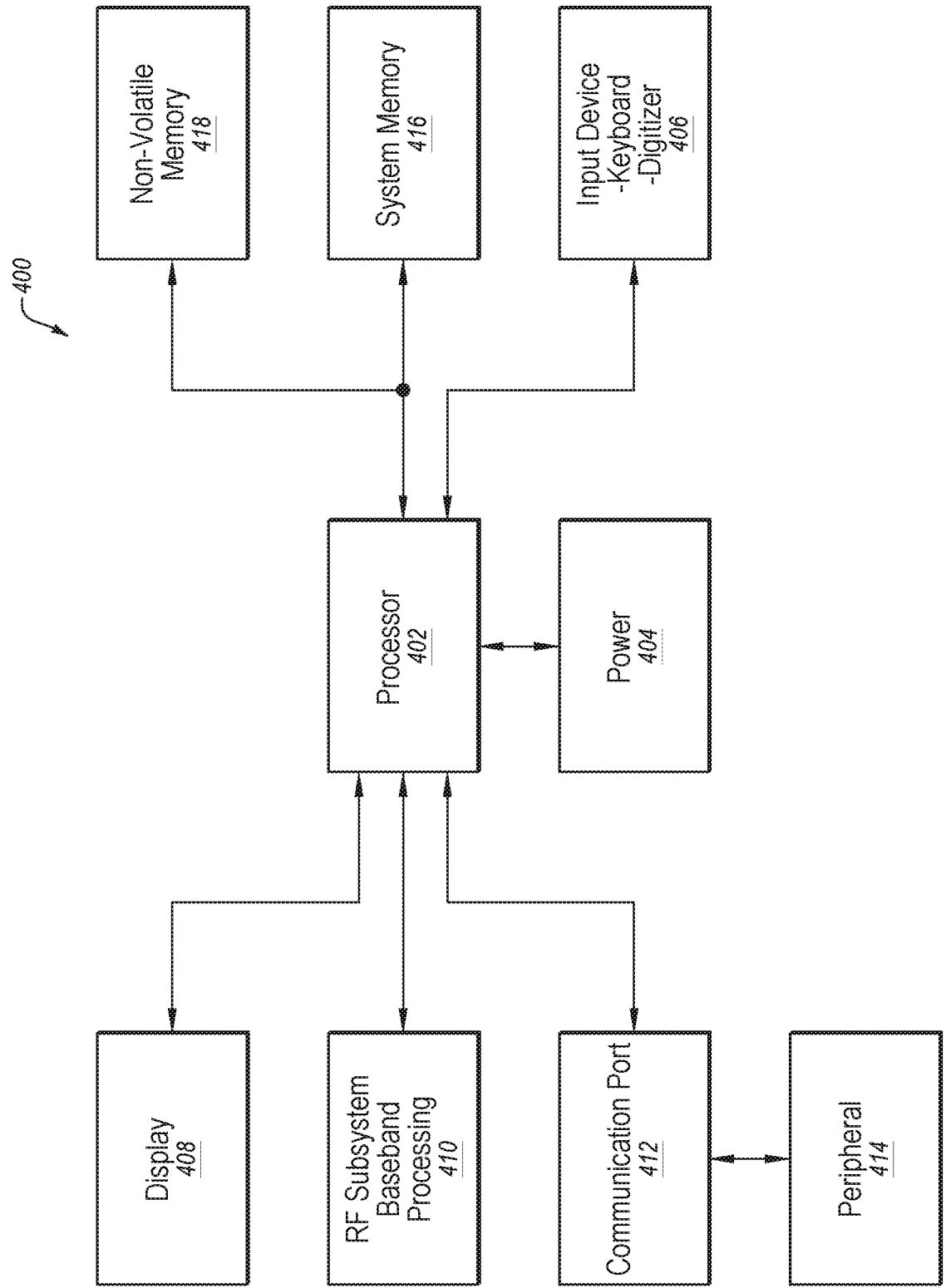
FIG. 4 is a block diagram of a processor-based system, in accordance with embodiments of the disclosure.

With reference to FIG. 4, depicted is a processor-based system 400. The processor-based system 400 may include various microelectronic devices and microelectronic device structures (e.g., microelectronic devices and microelectronic device structures including one or more of the microelectronic device 100, 200) manufactured in accordance with embodiments of the present disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include microelectronic devices and microelectronic device structures (e.g., microelectronic devices and microelectronic device structures including one or more of the microelectronic devices 100, 200) manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as the microelectronic devices and microelectronic device structures (e.g., the microelectronic device 100, 200) described above, or a combination thereof.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as the microelectronic devices and microelectronic device structures (e.g., the microelectronic device 100, 200) described above, or a combination thereof.

Thus, in accordance with embodiments of the disclosure an electronic system comprises an input device, an output device, a processor device operably coupled to the input device and the output device, and a memory device operably coupled to the processor device and comprising at least one microelectronic device. The at least one microelectronic device comprises a recessed access device comprising a first electrode between a first pillar of a semiconductive material and a second pillar of the semiconductive material, and an oxide material between the first electrode and each of the first pillar and the second pillar. The at least one microelectronic device further comprises a passing word line structure adjacent to the second pillar, the passing word line structure comprising a second electrode adjacent to the second pillar, and another oxide material between the second electrode and the second pillar. The at least one microelectronic device further comprises an isolation structure directly underlying the passing word line structure and comprising a widened portion having a larger lateral dimension than a lateral dimension of the passing word line structure.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a first pillar of a semiconductive material;
   a second pillar of the semiconductive material adjacent to the first pillar of the semiconductive material;
   an active word line extending between the first pillar and the second pillar; and
   a passing word line extending on a side of the second pillar opposite the active word line, the passing word line extending into an isolation region within the semiconductive material, the isolation region comprising a lower portion and an upper portion having a substantially circular cross-sectional shape and a larger lateral dimension than the lower portion.

2. The microelectronic device of claim 1, further comprising an additional active word line adjacent to the active word line.

3. The microelectronic device of claim 2, further comprising an additional passing word line, the active word line and the additional active word line between the passing word line and the additional passing word line.

4. The microelectronic device of claim 1, further comprising a storage element electrically coupled to the second pillar.

5. The microelectronic device of claim 1, further comprising a dielectric material between:
   the active word line and the first pillar; and
   the passing word line and the second pillar.

6. The microelectronic device of claim 5, further comprising an insulative material extending from the isolation region and along the dielectric material between the passing word line and the second pillar.

7. The microelectronic device of claim 5, wherein the dielectric material comprises a different material composition than the isolation region.

8. The microelectronic device of claim 1, wherein the upper portion has a diameter within a range from about 10 nanometers (nm) to about 40 nm.

9. The microelectronic device of claim 1, wherein the upper portion of the isolation region laterally extends farther than the passing word line.

10. The microelectronic device of claim 1, wherein the isolation region comprises silicon dioxide.

11. The microelectronic device of claim 1, wherein the isolation region comprises aluminum oxide.

12. The microelectronic device of claim 1, wherein a distance between opposing sidewalls of the second pillar is less than a distance between opposing sidewalls of the first pillar.

13. A microelectronic device, comprising:
   a first pillar of a semiconductive material;
   second pillars of a semiconductive material adjacent to the first pillar of the semiconductive material, the second pillars having a smaller lateral dimension than the first pillar;
   a first electrode structure between the first pillar and each of the second pillars;
   second electrode structures on a side of the second pillars opposite the first electrode structures; and
   an insulative material between the first electrode structure and the first pillar and between the second electrode structures and the second pillars, the insulative material between the second electrode structures and the second pillars having a greater thickness than the insulative material between the first electrode structure and the first pillar.

14. The microelectronic device of claim 13, further comprising isolation structures directly underlying the second electrode structures, the isolation structures comprising a substantially circular cross-sectional shape having a larger lateral dimension than the second electrode structures.

15. The microelectronic device of claim 14, wherein at least a portion of the isolation structures extends below the first electrode structure.

16. The microelectronic device of claim 13, wherein a height of the first electrode structure is different from a height of the second electrode structures.

17. An electronic system, comprising:
   an input device;
   an output device;
   a processor device operably coupled to the input device and the output device; and
   a memory device operably coupled to the processor device and comprising at least one microelectronic device, the at least one microelectronic device comprising:
      a recessed access device comprising:
         a first electrode between a first pillar of a semiconductive material and a second pillar of the semiconductive material; and
         an oxide material between the first electrode and each of the first pillar and the second pillar;
      a passing word line structure adjacent to the second pillar, the passing word line structure comprising:
         a second electrode adjacent to the second pillar; and
         another oxide material between the second electrode and the second pillar; and
      an isolation structure directly underlying the passing word line structure and comprising a widened portion comprising a substantially circular cross-sectional shape and having a larger lateral dimension than a lateral dimension of the passing word line structure.

18. A method of forming a microelectronic device, the method comprising:
   forming isolation structures in a semiconductive material, forming the isolation structures comprising:
      forming a first pattern of openings in a material;
      forming a second pattern of openings laterally offset from the first pattern of openings in the material;
      transferring the first pattern of openings and the second pattern of openings to a base material; and
      filling the openings in the base material with an insulative material;
   removing a portion of the insulative material to form openings above the isolation structures and removing portions of the semiconductive material between the isolation structures to form:
      a first pillar of the semiconductive material; and
      second pillars of the semiconductive material adjacent to the first pillar of the semiconductive material, the second pillars having a smaller lateral dimension than the first pillar;
   forming a conductive material adjacent a dielectric material to form:
      a first electrode structure between the first pillar and each of the second pillars; and
      second electrode structures on a side of the second pillars opposite the first electrode structures, the insulative material between the first electrode structure and the first pillar and between the second electrode structures and the second pillars, the insulative material between the second electrode structures and the second pillars having a greater thickness than the insulative material between the first electrode structure and the first pillar.

19. The method of claim 18, wherein transferring the first pattern of openings and the second pattern of openings to a base material comprises isotropically removing a portion of the base material.

20. The method of claim 18, wherein removing a portion of the insulative material and removing portions of the semiconductive material between the isolation structures comprises removing the portion of the insulative material concurrently with removing the portions of the semiconductive material.

21. The method of claim 20, wherein removing portions of the semiconductive material comprises forming the first pillar and the second pillars between the isolation structures.

22. The method of claim 18, further comprising forming additional conductive materials within the semiconductive material between the isolation structures.

23. The method of claim 18, wherein removing a portion of the insulative material comprises leaving a portion of the insulative material on portions of the second pillars.

* * * * *

UNITED STATES PATENT AND TRADEMARK OFFICE
CERTIFICATE OF CORRECTION

PATENT NO. : 11,430,793 B2
APPLICATION NO. : 16/899339
DATED : August 30, 2022
INVENTOR(S) : Deepak Chandra Pandey, Venkata Naveen Kumar Neelapala and Haitao Liu It is certified that error appears in the above-identified patent and that said Letters Patent is hereby corrected as shown below:

In the Specification

| | | |
|---|---|---|
| Column 4, | Line 61, | change "$NbO_x$—" to --$NbO_x$-- |
| Column 10, | Line 35, | change "$C_3F_5, C_4F_5$" to --$C_3F_8, C_4F_8$-- |
| Column 13, | Line 25, | change "to the" to --to the lines-- |

Signed and Sealed this
Thirteenth Day of December, 2022

Katherine Kelly Vidal
*Director of the United States Patent and Trademark Office*